United States Patent
Hsieh et al.

(10) Patent No.: US 10,250,998 B2
(45) Date of Patent: Apr. 2, 2019

(54) MICRO-ELECTRO-MECHANICAL SYSTEMS (MEMS) DEVICE AND METHOD FOR FABRICATING THE MEMS

(71) Applicant: Solid State System Co., Ltd., Hsinchu (TW)

(72) Inventors: Tsung-Min Hsieh, New Taipei (TW); Chien-Hsing Lee, Hsinchu County (TW); Cheng-Wei Tsai, Taichung (TW)

(73) Assignee: Solid State Systems Co., Ltd., Hsinchu (TW)

( * ) Notice: Subject to any disclaimer, the term of this patent is extended or adjusted under 35 U.S.C. 154(b) by 0 days.

(21) Appl. No.: 15/335,420

(22) Filed: Oct. 26, 2016

(65) Prior Publication Data

US 2018/0115836 A1 Apr. 26, 2018

(51) Int. Cl.
| | |
|---|---|
| *H04R 19/04* | (2006.01) |
| *B81B 3/00* | (2006.01) |
| *B81C 1/00* | (2006.01) |
| *H04R 31/00* | (2006.01) |

(52) U.S. Cl.
CPC ............. *H04R 19/04* (2013.01); *B81B 3/001* (2013.01); *B81C 1/00984* (2013.01); *H04R 31/003* (2013.01); *B81B 2201/0257* (2013.01); *H04R 2201/003* (2013.01)

(58) Field of Classification Search
CPC combination set(s) only.
See application file for complete search history.

(56) References Cited

U.S. PATENT DOCUMENTS

| | | | |
|---|---|---|---|
| 8,502,329 B2 | 8/2013 | Hsieh et al. | |
| 8,590,136 B2 | 11/2013 | Yang et al. | |
| 8,860,154 B2 | 10/2014 | Wang | |
| 8,987,842 B2 | 3/2015 | Hsieh et al. | |
| 9,133,016 B2 | 9/2015 | Rombach | |
| 9,215,519 B2* | 12/2015 | Goida | H04R 1/04 |
| 9,695,038 B2* | 7/2017 | Cargill | H04R 19/005 |
| 2010/0065930 A1* | 3/2010 | Nakatani | B81C 1/00476 |
| | | | 257/415 |
| 2015/0110309 A1* | 4/2015 | Park | H04R 19/005 |
| | | | 381/190 |

* cited by examiner

*Primary Examiner* — Amir H Etesam
(74) *Attorney, Agent, or Firm* — JCIPRNET

(57) ABSTRACT

A Micro-Electro-Mechanical Systems (MEMS) device includes a substrate, a dielectric supporting layer, a diaphragm, a backplate. The substrate has a substrate opening corresponding to a diaphragm region. The dielectric supporting layer is disposed on the substrate, having a dielectric opening corresponding to the substrate opening to form the diaphragm region. The diaphragm within the dielectric opening is held by the dielectric supporting layer at a periphery. The backplate is disposed on the dielectric supporting layer, having a plurality of venting holes, connecting to the dielectric opening. The backplate includes a conductive layer and a passivation layer covering over the conductive layer at a first side opposite to the diaphragm, wherein a second side of the conductive layer is facing to the diaphragm and not covered by the passivation layer.

17 Claims, 27 Drawing Sheets

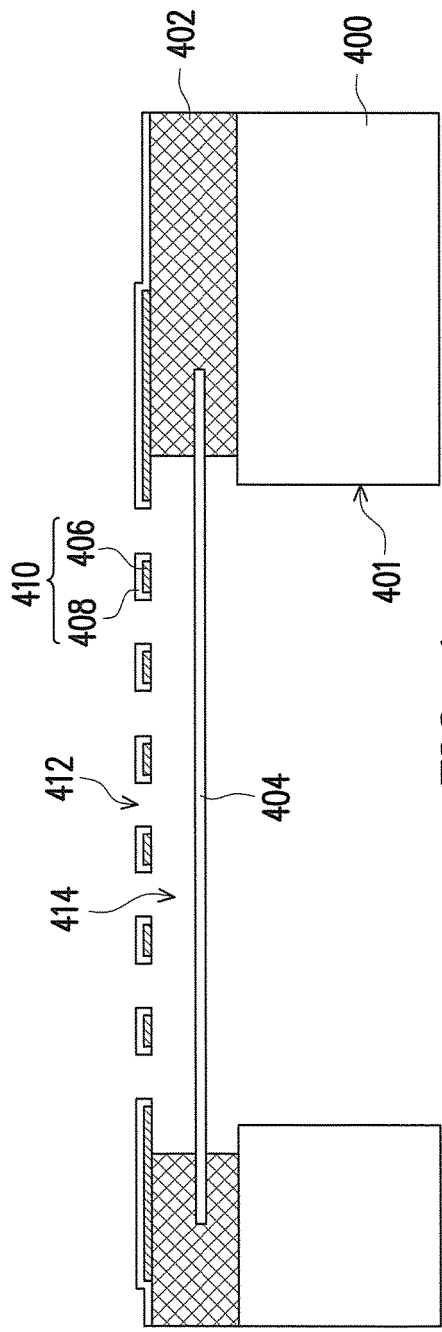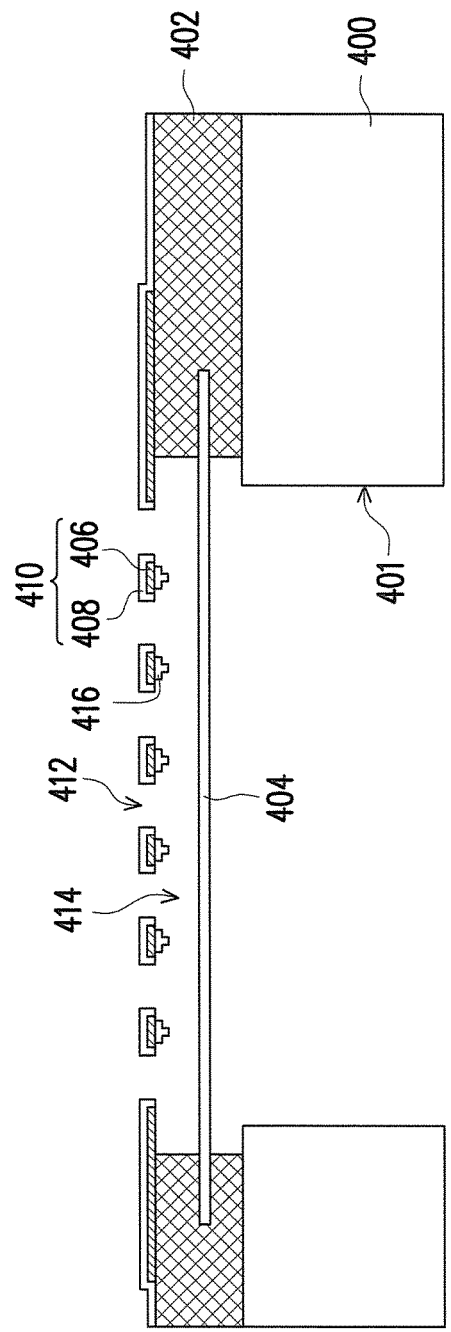

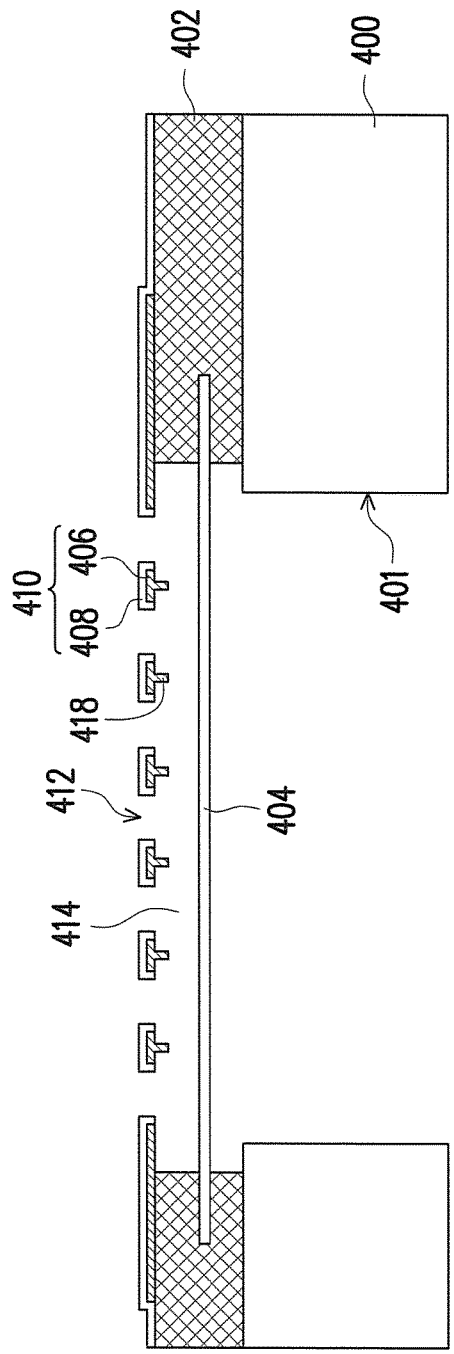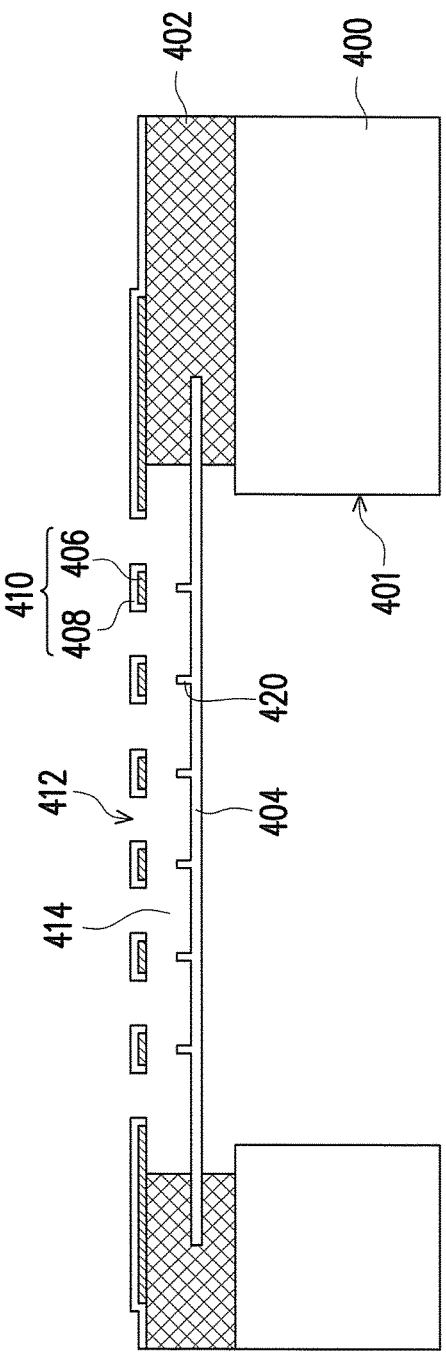
FIG. 3
FIG. 4

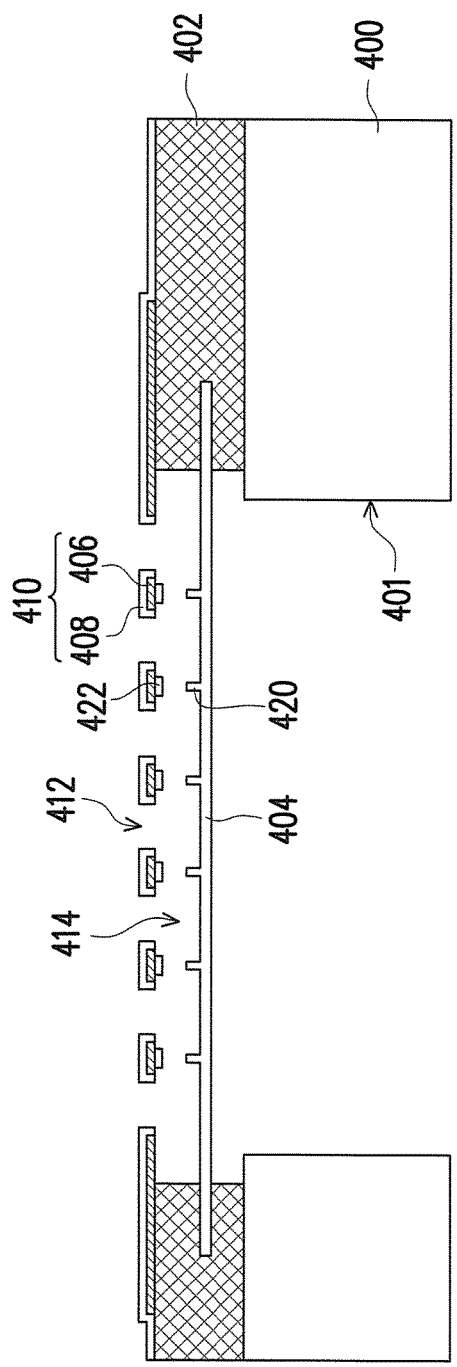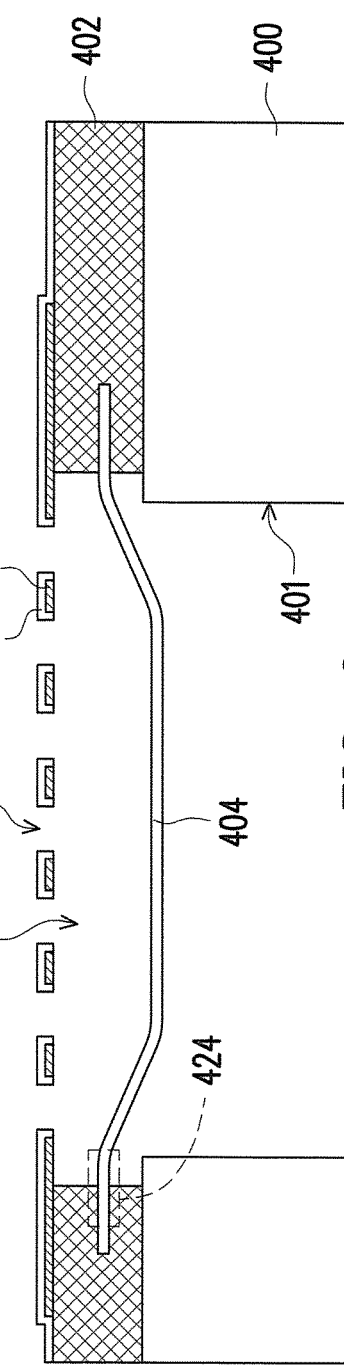

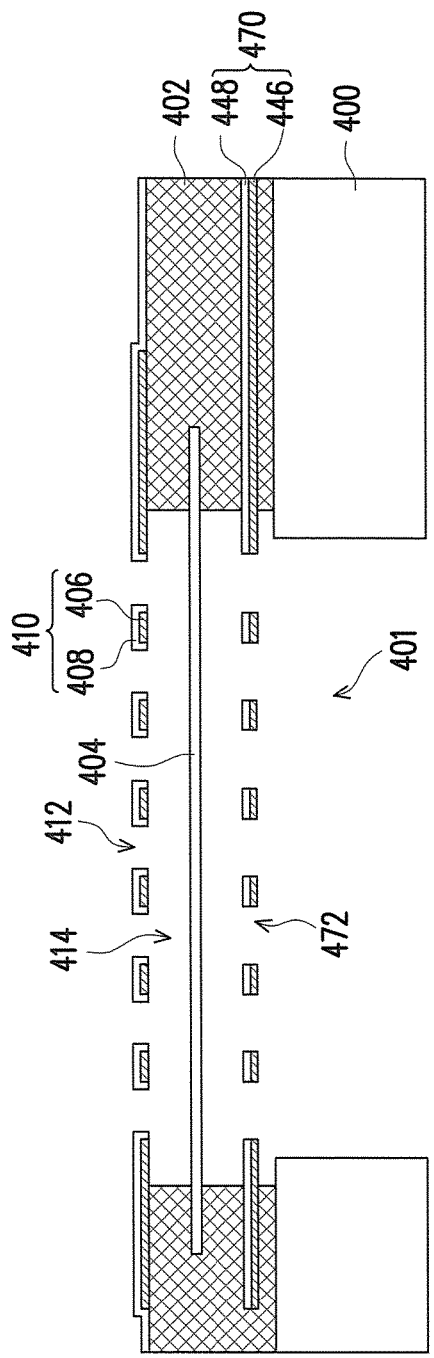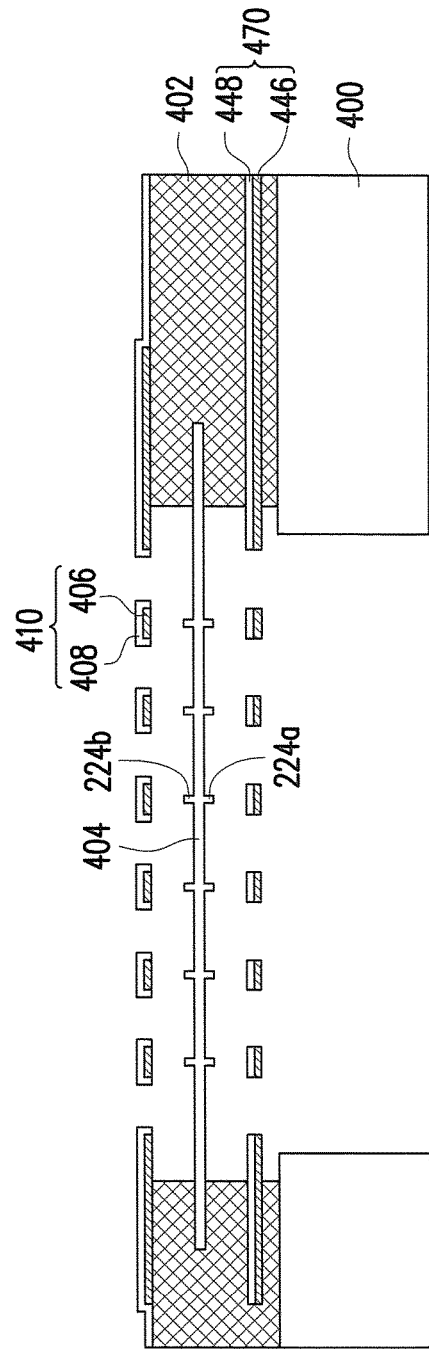

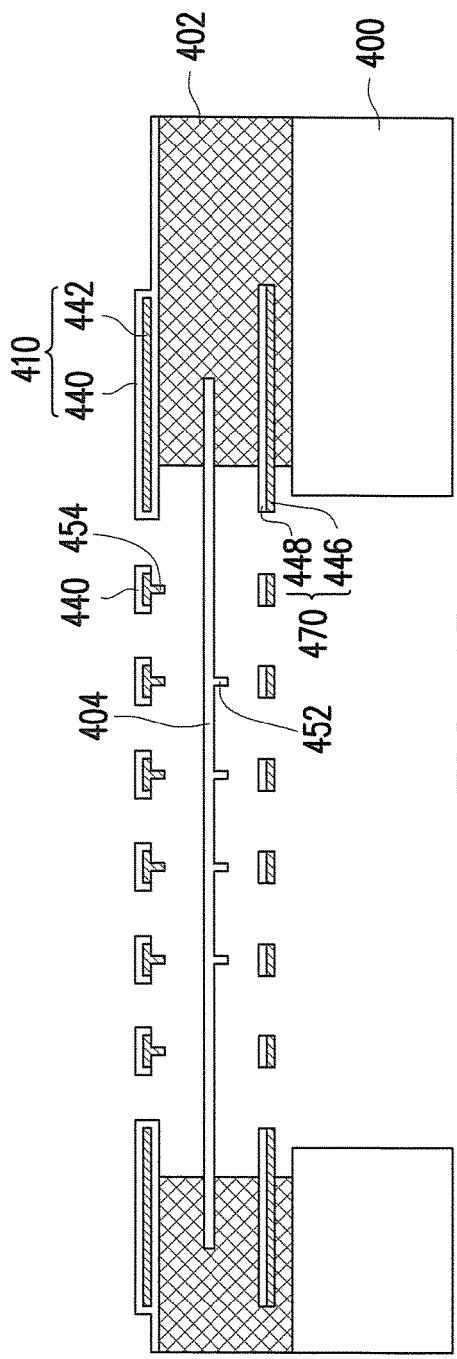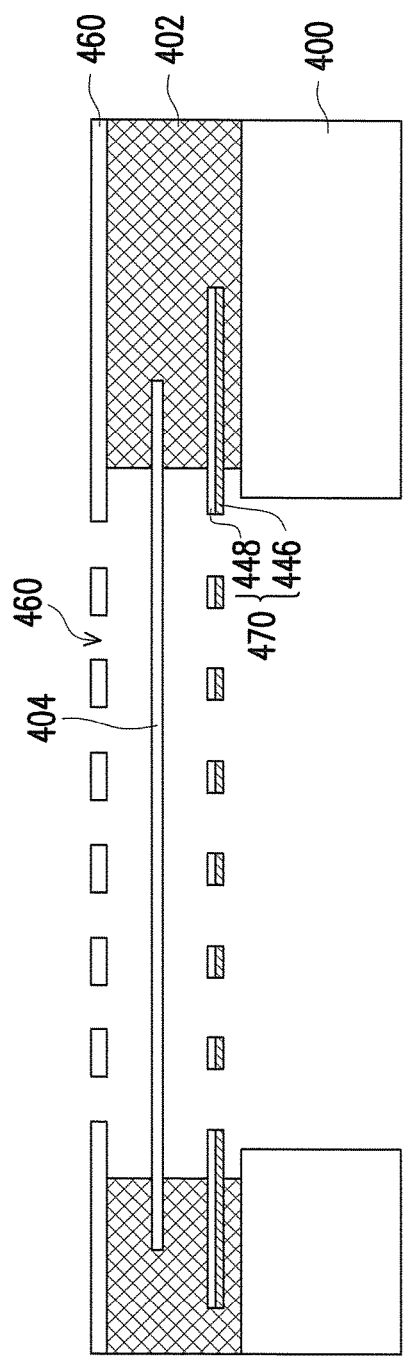

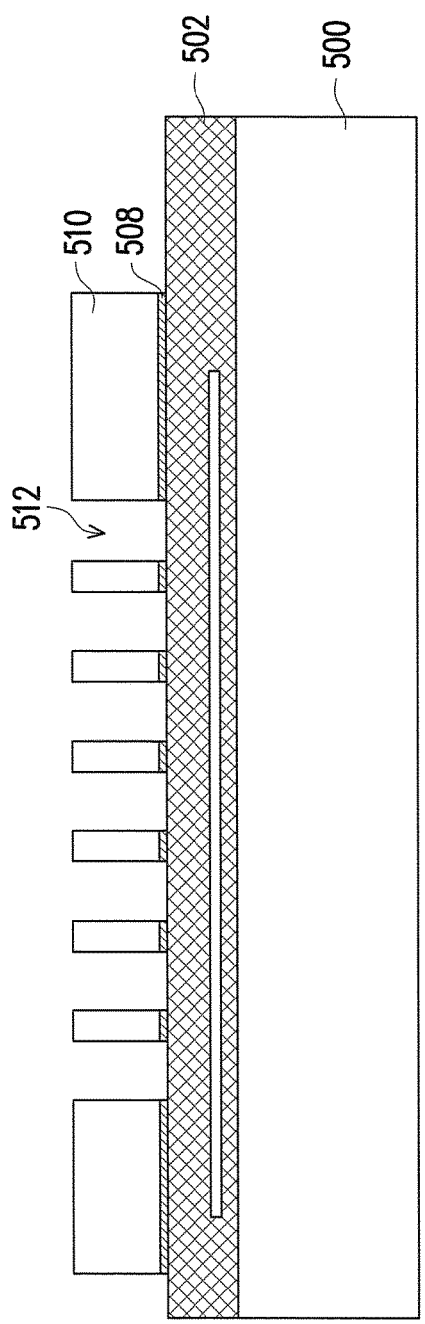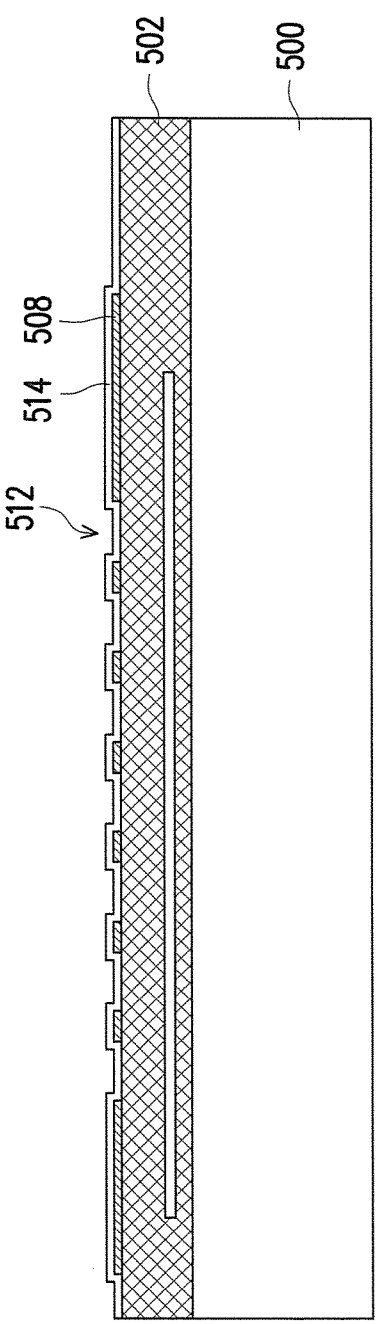
FIG. 15E
FIG. 15F

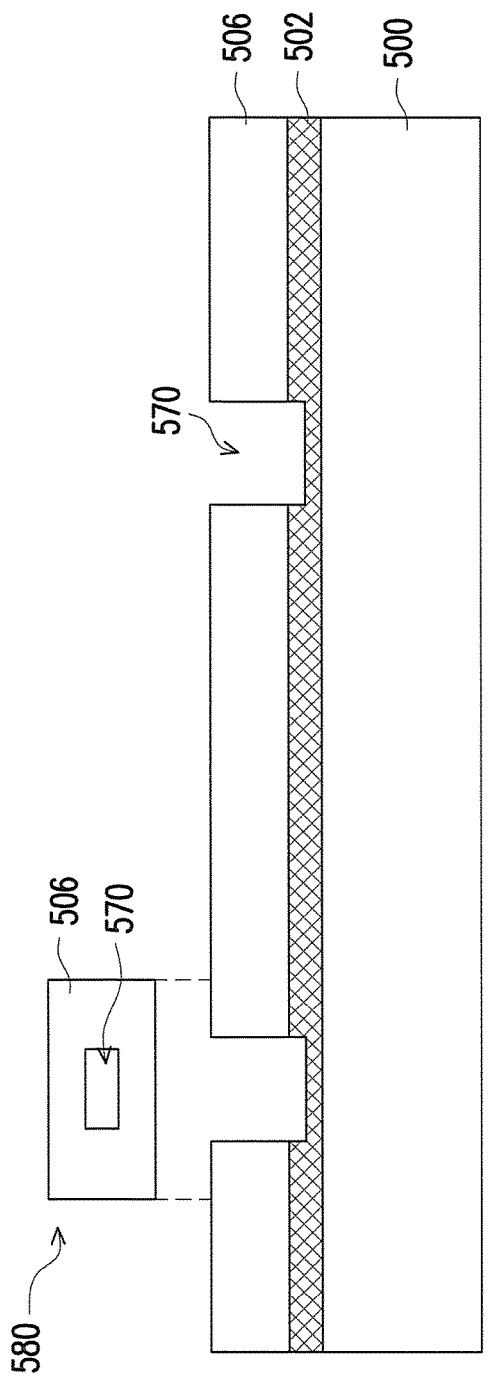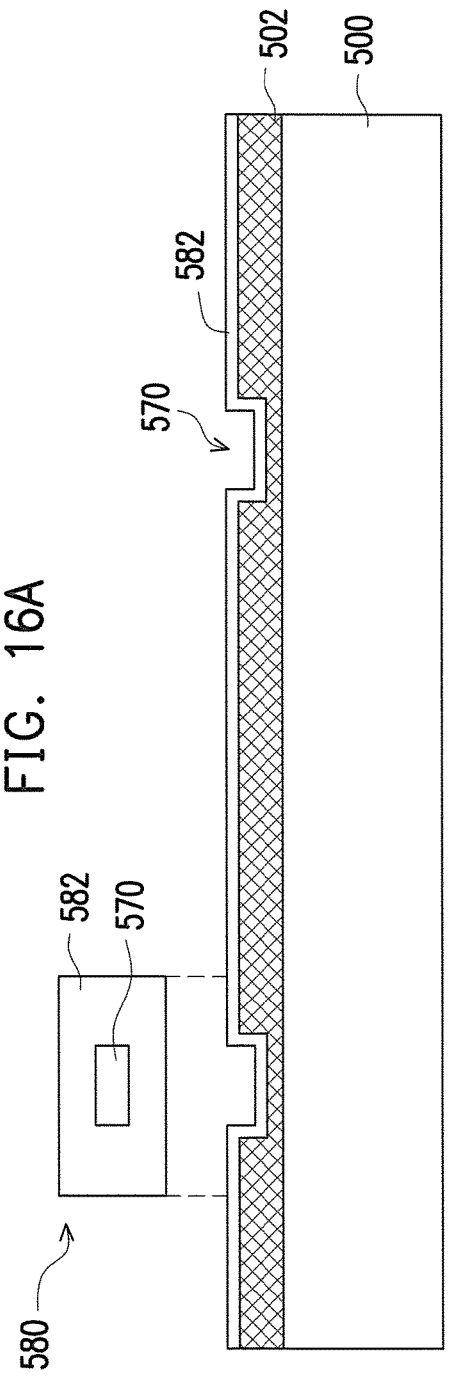

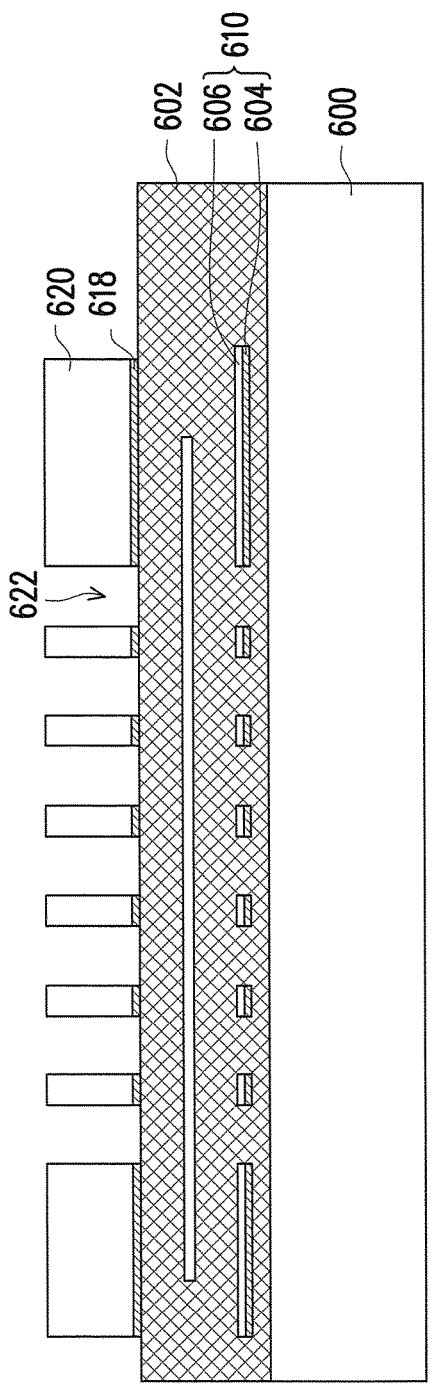
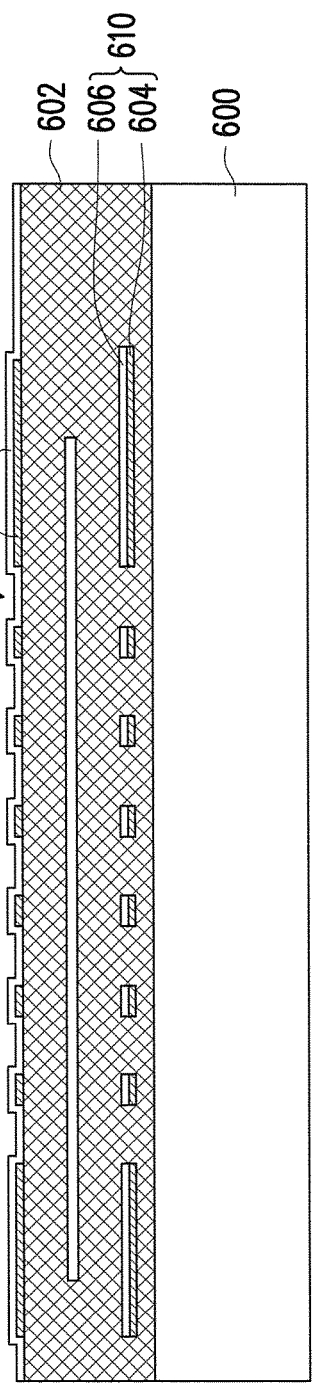
FIG. 17G
FIG. 17H

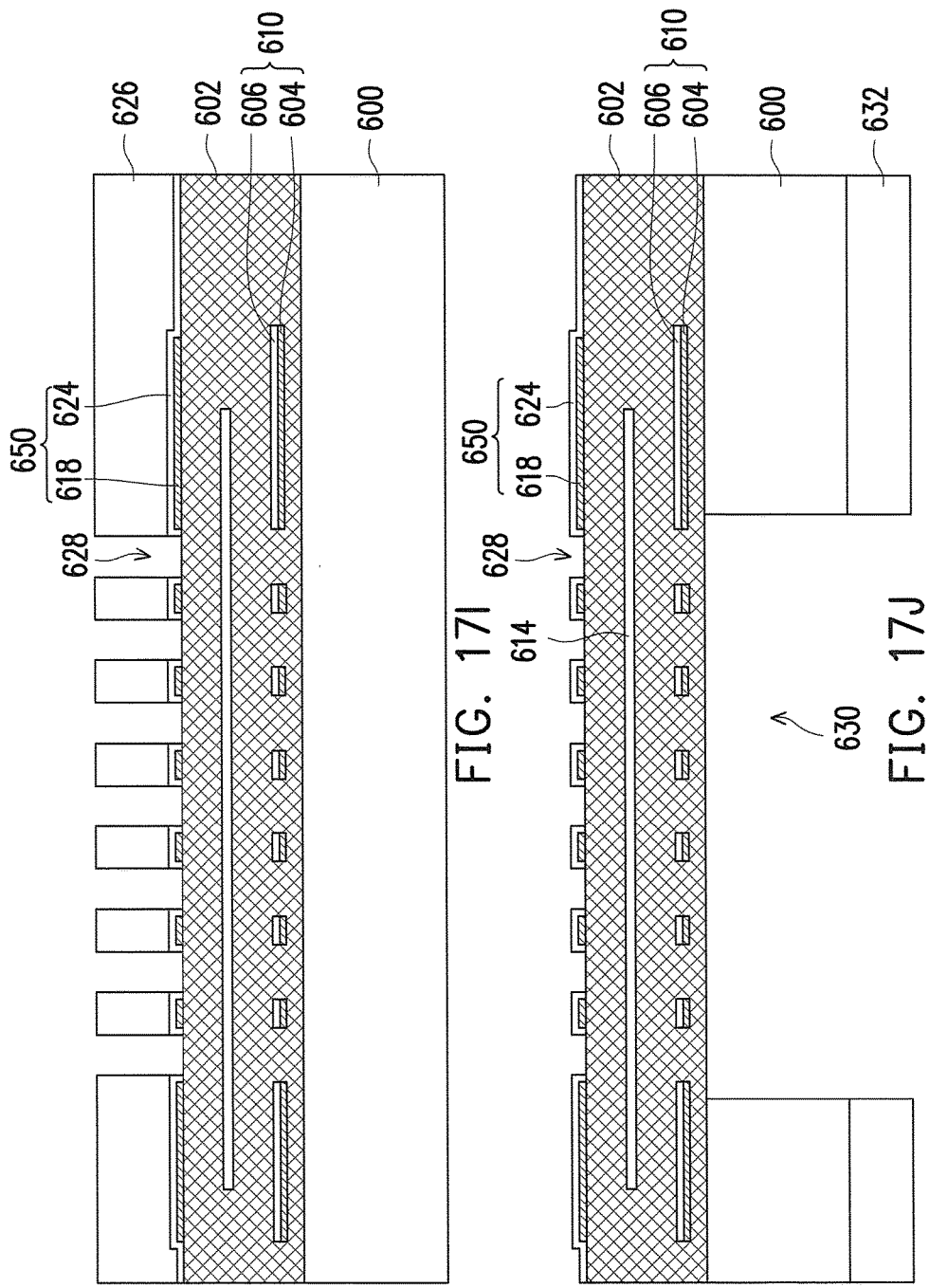

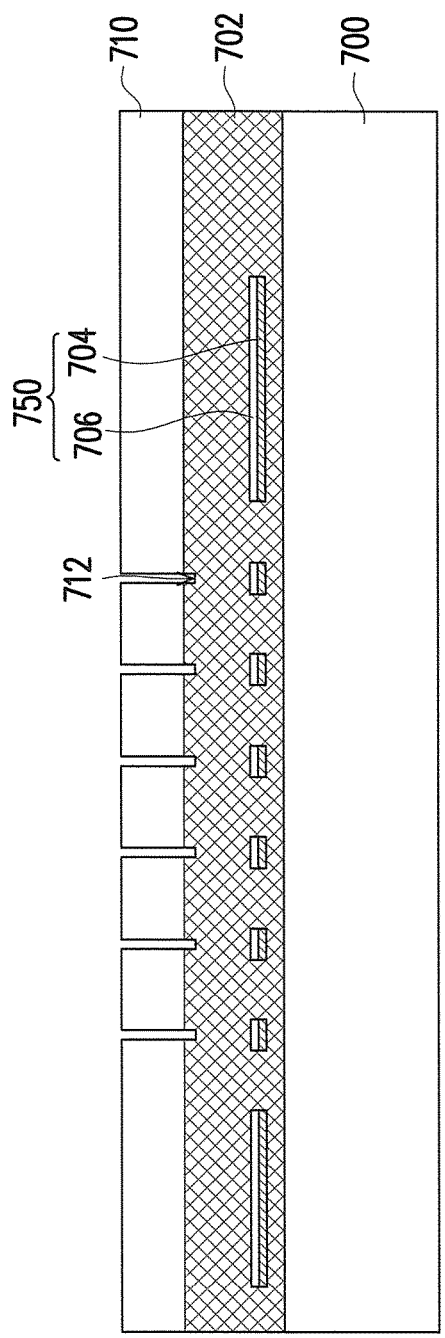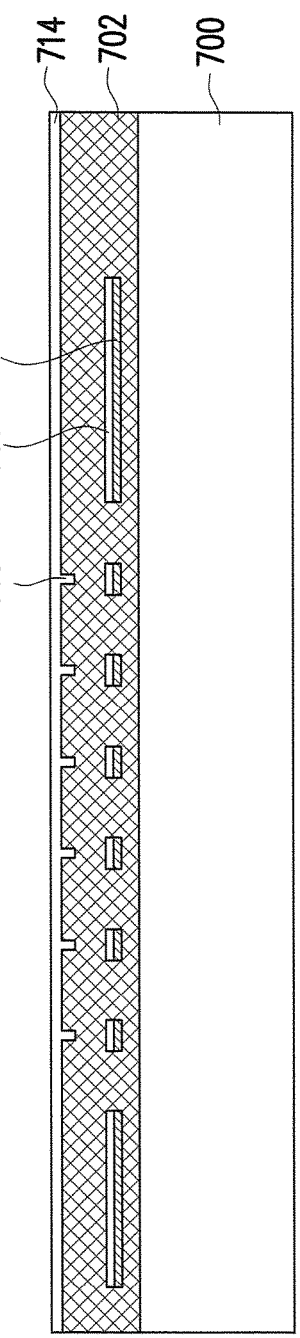
FIG. 19A
FIG. 19B

MICRO-ELECTRO-MECHANICAL SYSTEMS (MEMS) DEVICE AND METHOD FOR FABRICATING THE MEMS

BACKGROUND OF THE INVENTION

Field of Invention

The present invention relates to Micro-Electro-Mechanical Systems (MEMS) device. More particularly, the present invention relates to the structure and fabrication method for MEMS device with improved sensing capability.

Description of Related Art

MEMS device, such as MEMS microphone, has been popular due to the excellent features comparing to the conventional ECM microphone. The features of MEMS microphone includes: thin and small size; SMD (surface mountable device) indicating easy assembly with sold flow; and high stability and environmental resistance. Particularly, a MEMS microphone with greatly reduced size is suitable for various applications.

The conventional structure of MEMS device is based on a silicon substrate. The substrate has an opening corresponding to a diaphragm region to expose the diaphragm. A dielectric support layer on the substrate has an opening to define the diaphragm region. A passivation layer is disposed on the dielectric support layer. The dielectric support layer holds the backplate and the diaphragm. The backplate has multiple venting holes. A chamber is formed between the diaphragm and the backplate. The passivation layer also has an opening to expose the diaphragm.

For the conventional structure of MEMS device, such MEMS microphone, the diaphragm and the backplate are applied with two operation voltage levels to form as a capacitance during operation. The diaphragm senses the pressure of acoustic signal and changes the capacitances, so that the acoustic signal is transformed into electric signal for use in the electronic circuit.

However, the design of the MEMS device is still under developing to improve the performance.

SUMMARY OF THE INVENTION

The invention provides a MEMS device, which can have improved performance, such as sensitivity to the acoustic signal, linearity of electric signal, and so on.

The invention provides a MEMS device, including a substrate, a dielectric supporting layer, a diaphragm, a backplate. The substrate has a substrate opening corresponding to a diaphragm region. The dielectric supporting layer is disposed on the substrate, having a dielectric opening corresponding to the substrate opening to form the diaphragm region. The diaphragm within the dielectric opening is held by the dielectric supporting layer at a periphery. The backplate is disposed on the dielectric supporting layer, having a plurality of venting holes, connecting to the dielectric opening. The backplate comprises a conductive layer and a passivation layer covering over the conductive layer at a first side opposite to the diaphragm, wherein a second side of the conductive layer is facing to the diaphragm and not covered by the passivation layer.

The invention also provides a MEMS device, including a substrate, a dielectric supporting layer, a diaphragm, a backplate. The substrate has a substrate opening corresponding to a diaphragm region. The dielectric supporting layer is disposed on the substrate, having a dielectric opening corresponding to the substrate opening to form the diaphragm region. The diaphragm is within the dielectric opening, and held by the dielectric supporting layer at a periphery. The backplate is disposed on the dielectric supporting layer, having a plurality of venting holes, connecting to the dielectric opening. The backplate comprises a conductive layer and a passivation layer covered by the conductive layer at a side opposite to the diaphragm, wherein the passivation layer has a central portion and a peripheral portion. The central portion is corresponding to the diaphragm region to provide an anti-sticky structure. The peripheral portion is on the dielectric supporting layer and covered by a peripheral portion of the conductive layer.

The invention also provides a MEMS device, including a substrate, a dielectric supporting layer, a diaphragm, a first backplate, a second backplate. The substrate has a substrate opening corresponding to a diaphragm region. The dielectric supporting layer is disposed on the substrate, having a dielectric opening to form the diaphragm region. The diaphragm is held by the dielectric supporting layer at a periphery. The first backplate is disposed on the dielectric supporting layer, having a plurality of first venting holes, connecting to the dielectric opening. The first backplate comprises a conductive layer and a passivation layer covering over the conductive layer at a first side opposite to the diaphragm. The second side of the conductive layer within the dielectric opening is facing to the diaphragm and not covered by the passivation layer. The second backplate is between the substrate and the diaphragm and held by the dielectric supporting layer at a periphery, having a plurality of second venting holes, connecting between the substrate opening and the dielectric opening.

The invention also provides a MEMS device, including a substrate, a dielectric supporting layer, a diaphragm, a first backplate, a second backplate. The substrate has a substrate opening corresponding to a diaphragm region. The dielectric supporting layer is disposed on the substrate, having a dielectric opening to form the diaphragm region. The diaphragm is held by the dielectric supporting layer at a periphery. The first backplate is disposed on the dielectric supporting layer, having a plurality of first venting holes, connecting to the dielectric opening. The first backplate comprises a conductive layer and a passivation layer covered by the conductive layer at a side opposite to the diaphragm. The passivation layer has a central portion and a peripheral portion, the central portion is corresponding to the diaphragm region to provide an anti-sticky structure. The peripheral portion is on the dielectric supporting layer and covered by a peripheral portion of the conductive layer. The second backplate is between the substrate and the diaphragm and held by the dielectric supporting layer at a periphery, having a plurality of second venting holes, connecting between the substrate opening and the dielectric opening.

The invention also provides a MEMS device, including a substrate, a dielectric supporting layer, a diaphragm, a first backplate and a second backplate. The substrate has a substrate opening corresponding to a diaphragm region. The diaphragm is held by the dielectric supporting layer at a periphery. The dielectric supporting layer is disposed on the substrate, having a dielectric opening to form the diaphragm region. The first backplate is disposed on the dielectric supporting layer, having a plurality of first venting holes, connecting to the dielectric opening, wherein the first backplate is just a passivation layer. The second backplate, held by the dielectric supporting layer at a periphery, having a plurality of second venting holes, connecting between the substrate opening and the dielectric opening.

The invention also provides a method for fabricating a MEMS device on a substrate. The method comprises: forming a dielectric supporting layer on the substrate, wherein the dielectric supporting layer is embedded with a diaphragm; forming a first backplate on the dielectric supporting layer, wherein the first backplate has been patterned to have a plurality of venting holes with a diaphragm region as predetermined, wherein the first backplate comprises a conductive layer on the dielectric supporting layer and a passivation layer covering over the conductive layer; patterning the substrate from a side opposite to the dielectric supporting layer, to form a substrate opening to expose the dielectric supporting layer; and performing an isotropic etching process, to remove a portion of dielectric material of the dielectric supporting layer through the venting holes and the substrate opening, so that the dielectric supporting layer has a dielectric opening to expose the diaphragm within the diaphragm region.

The invention also provides a method for fabricating a MEMS device on a substrate. The method comprises: forming a dielectric supporting layer on the substrate, wherein the dielectric supporting layer is embedded with a diaphragm; forming a first backplate on the dielectric supporting layer, wherein the first backplate has been patterned to have a plurality of venting holes with a diaphragm region as predetermined, wherein the first backplate is just a passivation layer; patterning the substrate from a side opposite to the dielectric supporting layer, to form a substrate opening to expose the dielectric supporting layer; and performing an isotropic etching process, to remove a portion of dielectric material of the dielectric supporting layer through the venting holes and the substrate opening, so that the dielectric supporting layer has a dielectric opening to expose the diaphragm within the diaphragm region.

The invention also provides a method for fabricating a MEMS device on a substrate. The method comprises: forming a dielectric supporting layer on the substrate, wherein the dielectric supporting layer is embedded with a diaphragm, wherein the diaphragm is patterned to have a plurality of indents distributed along a peripheral region; forming a first backplate on the dielectric supporting layer, wherein the first backplate has been patterned to have a plurality of venting holes with a diaphragm region as predetermined, wherein the first backplate comprises a conductive layer on the dielectric supporting layer and a passivation layer covering over the conductive layer; patterning the substrate from a side opposite to the dielectric supporting layer, to form a substrate opening to expose the dielectric supporting layer; and performing an isotropic etching process, to remove a portion of dielectric material of the dielectric supporting layer through the venting holes and the substrate opening, so that the dielectric supporting layer has a dielectric opening to expose the diaphragm within the diaphragm region. The dielectric opening also exposes an inner portion of each of the indents of the diaphragm.

The invention also provides a method for fabricating a MEMS device on a substrate. The method comprises: forming a dielectric supporting layer on the substrate, wherein the dielectric supporting layer is embedded with a diaphragm; forming a first backplate on the dielectric supporting layer, wherein the backplate has been patterned to have a plurality of venting holes with a diaphragm region as predetermined, wherein the backplate comprises a conductive layer on the dielectric supporting layer and a passivation layer covering over the conductive layer, wherein the passivation layer of the first backplate comprises a peripheral portion which surrounds a peripheral portion of the conductive layer to be held by the dielectric supporting layer at an end state; patterning the substrate from a side opposite to the dielectric supporting layer, to form a substrate opening to expose the dielectric supporting layer; and performing an isotropic etching process, to remove a portion of dielectric material of the dielectric supporting layer through the venting holes and the substrate opening, so that the dielectric supporting layer has a dielectric opening to expose the diaphragm within the diaphragm region. The dielectric opening also exposes an inner portion of each of the indents of the diaphragm.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a cross-sectional view, schematically illustrating a structure of MEMS device, according to an embodiment of the invention.

FIG. 2 is a cross-sectional view, schematically illustrating a structure of MEMS device, according to an embodiment of the invention.

FIG. 3 is a cross-sectional view, schematically illustrating a structure of MEMS device, according to an embodiment of the invention.

FIG. 4 is a cross-sectional view, schematically illustrating a structure of MEMS device, according to an embodiment of the invention.

FIG. 5 is a cross-sectional view, schematically illustrating a structure of MEMS device, according to an embodiment of the invention.

FIG. 6 is a cross-sectional view, schematically illustrating the diaphragm in operation in the device based on the MEMS device in FIG. 1.

FIG. 9 is a cross-sectional view, schematically illustrating a structure of MEMS device, according to an embodiment of the invention.

FIG. 10 is a cross-sectional view, schematically illustrating a structure of MEMS device, according to an embodiment of the invention.

FIG. 13 is a cross-sectional view, schematically illustrating a structure of MEMS device, according to an embodiment of the invention.

FIG. 14 is a cross-sectional view, schematically illustrating a structure of MEMS device, according to an embodiment of the invention.

FIGS. 15A-15I are cross-sectional views, schematically illustrating fabrication flow for a MEMS device, according to an embodiment of the invention.

FIGS. 16A-16D are cross-sectional views, schematically illustrating fabrication flow for a MEMS device, according to an embodiment of the invention.

FIGS. 17A-17K are cross-sectional views, schematically illustrating fabrication flow for a MEMS device, according to an embodiment of the invention.

FIGS. 19A-19E are cross-sectional views, schematically illustrating fabrication flow for a MEMS device, according to an embodiment of the invention.

DESCRIPTION OF THE PREFERRED EMBODIMENTS

Figure 7:
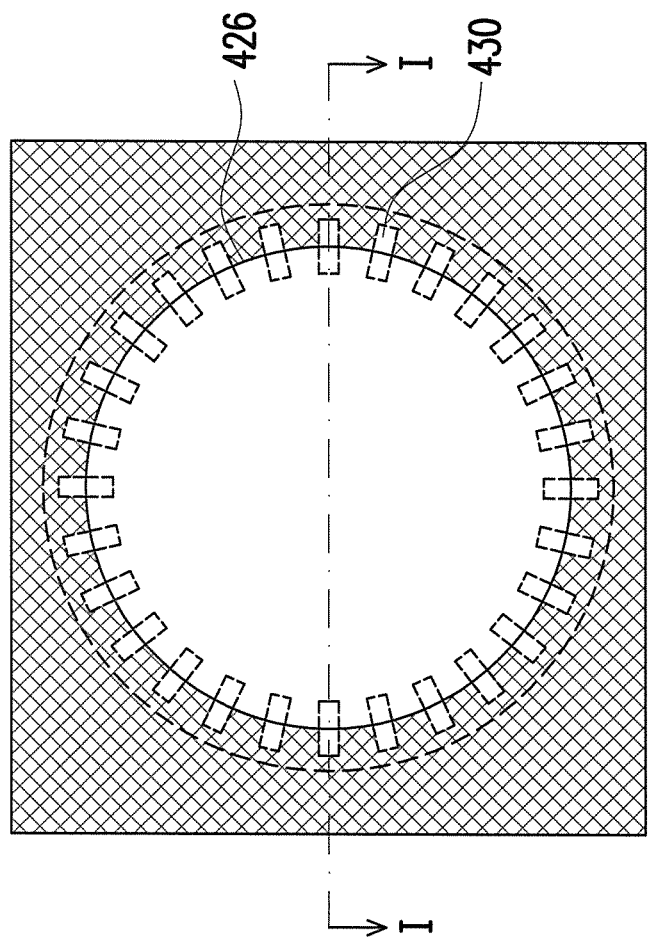
FIG. 7 is a top view, schematically illustrating a structure of MEMS device, according to an embodiment of the invention.

In the invention, a novel MEMS device is proposed, of which at least the sensitivity can be improved. Several embodiments are provided for describing the invention. However, the invention is not just limited to the embodiments.

In an embodiment, the invention has proposed the MEMS device with dual backplates to form two capacitors on both sides of the diaphragm. The capacitance can be about doubled and the electric forces on both sides of the diaphragm can be balanced in betted condition. As a result, the performance of the MEMS device can be improved.

The invention also additionally proposes the structures for the backplate, which can be a structure of single backplate as itself or can be applied in combination to replace one of dual backplate. More embodiments are provided to describe the structure either in single backplate or in dual backplates.

As noted, although multiple embodiments are provided to describe the invention, the invention is not just limited to the embodiments as provided. A proper combination between the embodiments may also be made.

FIG. 1 is a cross-sectional view, schematically illustrating a structure of MEMS device, according to an embodiment of the invention. Referring to FIG. 1, the MEMS device in single plate is provided for descriptions. The MEMS device includes a substrate 400, a dielectric supporting layer 402, a diaphragm 404, and a backplate 410. The substrate 400, such as silicon substrate or semiconductor substrate, has a substrate opening 401 corresponding to a diaphragm region as predetermined at the intended location. The dielectric supporting layer 402, actually including multiple sub layers, is disposed on the substrate 400, having a dielectric opening 414 corresponding to the substrate opening 401 to form the diaphragm region. The diaphragm 404 within the dielectric opening 414 is held by the dielectric supporting layer 402 at a periphery. The backplate 410 is disposed on the dielectric supporting layer 402, having a plurality of venting holes 412, connecting to the dielectric opening 414. The backplate 410 comprises a conductive layer 406 and a passivation layer 408 covering over the conductive layer 406 at a first side opposite to the diaphragm 404. A second side of the conductive layer 406 is facing to the diaphragm 404 and not covered by the passivation layer 408.

In the embodiment, the passivation layer 408 can be, for example, silicon nitride while the dielectric supporting layer 402 can be, for example, silicon oxide. The passivation layer 408 improves the stiffness to the conductive layer 406, so to form together as a backplate with multiple venting holes 412. The dielectric opening 414 release the diaphragm 404.

Further in another example, FIG. 2 is a cross-sectional view, schematically illustrating a structure of MEMS device, according to an embodiment of the invention. Referring to FIG. 2, the MEMS device in single backplate is provided for descriptions. The MEMS device similar to the MEMS device in FIG. 1 includes a substrate 400, a dielectric supporting layer 402, a diaphragm 404, and a backplate 410. The difference in FIG. 2 from FIG. 1 is the structure of backplate 410. In the embodiment of FIG. 2, an anti-sticky structure 416 is further formed on the second side of the conductive layer 406 of the backplate 410. The anti-sticky structure 416 in this embodiment can be a ㄀-like structure in cross-sectional view surrounding the venting holes 412.

Further in another embodiment, FIG. 3 is a cross-sectional view, schematically illustrating a structure of MEMS device, according to an embodiment of the invention. In FIG. 3, the MEMS device similar to the MEMS device in FIG. 1 includes a substrate 400, a dielectric supporting layer 402, a diaphragm 404, and a backplate 410. In comparing with the MEMS device of FIG. 1, the difference of the MEMS device in FIG. 3 from FIG. 1 is the anti-sticky structure 418. In this embodiment, the conductive layer 406 of the backplate 410 further includes the anti-sticky structure 416, protruding from the second side of the conductive layer 406, so to be protruding toward the diaphragm 404.

Further in another embodiment, FIG. 4 is a cross-sectional view, schematically illustrating a structure of MEMS device, according to an embodiment of the invention. In FIG. 4, the MEMS device similar to the MEMS device in FIG. 1 includes a substrate 400, a dielectric supporting layer 402, a diaphragm 404, and a backplate 410. In comparing with the MEMS device of FIG. 1, the difference of the MEMS device in FIG. 4 from FIG. 1 is the anti-sticky structure 420. In this embodiment, the diaphragm 404 can be additionally formed on the diaphragm 404 at the surface facing to the backplate 410. In this situation, the backplate 410 does not need another anti-sticky structure. The anti-sticky structure 420 in an example can be just a protruding stick with the same material as the diaphragm 404, and additionally formed in the procedure for fabricating the diaphragm 404.

Further in another embodiment, FIG. 5 is a cross-sectional view, schematically illustrating a structure of MEMS device, according to an embodiment of the invention. In FIG. 5, the MEMS device similar to the MEMS device in FIG. 1 includes a substrate 400, a dielectric supporting layer 402, a diaphragm 404, and a backplate 410. In comparing with the MEMS device of FIG. 1, the difference of the MEMS device in FIG. 5 from FIG. 1 is the anti-sticky structure 420 (like the anti-sticky structure in FIG. 4) and the anti-sticky structure 422. In this embodiment, the anti-sticky structure 420 in an example can be just a protruding stick with the same material as the diaphragm 404, and additionally formed in the procedure for fabricating the diaphragm 404. However, the conductive layer 406 of the backplate further includes the additional anti-sticky structure 422, protruding from the second side of the conductive layer 406 and corresponding to the anti-sticky structure 420 of the diaphragm 404. The anti-sticky structure 422 in this situation is made of dielectric material, such as silicon nitride which is the same as the passivation layer 408. The anti-sticky structure 422 in an example may just provide a small flat surface for contacting with the anti-sticky structure 420.

The invention has further considered the structure of the diaphragm 404 and noted an issue about damage on the diaphragm. FIG. 6 is a cross-sectional view, schematically illustrating the diaphragm in operation in the device based on the MEMS device in FIG. 1. In FIG. 6, the diaphragm 404 operated in the MEMS device is to sense the vibration of acoustic signal. So, the diaphragm 404 is vibrating with the acoustic signal. When the diaphragm 404 is vibrating, the diaphragm 404 is in a concave situation, like the structure in FIG. 6 as an example. However, the periphery of the diaphragm 404 is firmly held by the dielectric supporting layer 402 at the region 424 with high stress. The diaphragm 404 is easily broken, such as crack, at the edge region exposed by the dielectric opening 414.

Figure 8:
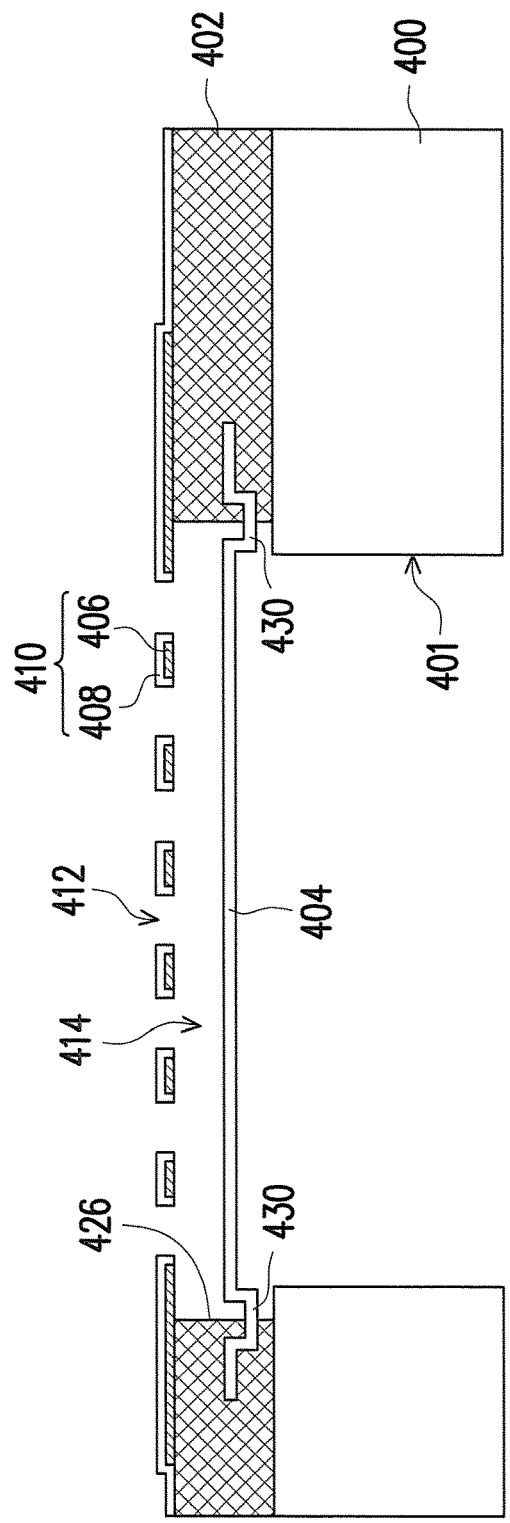
FIG. 8 is a cross-sectional view in FIG. 7 along the cutting line at I-I, schematically illustrating a structure of MEMS device, according to an embodiment of the invention.

To solve the issue stated in FIG. 6, the invention provides an additional structure for the diaphragm 404. FIG. 7 is a top view, schematically illustrating a structure of MEMS device, according to an embodiment of the invention. FIG. 8 is a cross-sectional view in FIG. 7 along the cutting line at I-I, schematically illustrating a structure of MEMS device, according to an embodiment of the invention.

Referring to FIG. 7 and FIG. 8, the diaphragm 404 in an example is a circular diaphragm to sense the air pressure caused by the acoustic signal. However, the diaphragm 404 is not limited to the circular diaphragm. Any suitable geometric shape can be adapted. Taking the circular diaphragm as an example, a plurality of indent portions 430 are formed at the peripheral region of the diaphragm 404. For example, the indent portions are evenly distributed along the peripheral region. The sidewall 426 of the dielectric opening 414 is crossing the indent portions 430. As a result, the dielectric supporting layer 402 just covers the outer part of the indent portions 430. In other words, the dielectric opening 414 exposes an inner part of each of the indent portions 430.

Duet to the indent portions 430 the mechanical strength at the peripheral region of the diaphragm 404 is improved and can resist the stress without cracking. Further, the indent portions 430 can be indenting upward or downward although the example is shown by indenting downward.

For the embodiments above with single backplate can be adapted into the MEMS device with dual backplates. The embodiments can also be suitably combined without limited to a single embodiment itself. The structures of the backplate can be applied to dual backplate. The diaphragm 404 with the indent portions can be applied to all of the embodiments. Several embodiments for applying the single backplate into dual backplates are provided for description. However, the invention not limited to the embodiments as provided.

FIG. 9 is a cross-sectional view, schematically illustrating a structure of MEMS device, according to an embodiment of the invention. Referring to FIG. 9, the MEMS device with dual backplates may include a substrate 400, a dielectric supporting layer 402, a diaphragm 404, a first backplate 410, and a second backplate 470. The substrate 400 has a substrate opening 401 corresponding to a diaphragm region. The dielectric supporting layer 402 is disposed on the substrate 400, having a dielectric opening 414 to form the diaphragm region. The diaphragm 404 is held by the dielectric supporting layer 402 at a periphery. The first backplate 410 is disposed on the dielectric supporting layer 402, having a plurality of first venting holes 412, connecting to the dielectric opening 414. The first backplate 410 comprises a conductive layer 406 and a passivation layer 408 covering over the conductive layer 406 at a first side opposite to the diaphragm 404. The second side of the conductive layer 406 within the dielectric opening 414 is facing to the diaphragm 404 and not covered by the passivation layer 408. The second backplate 470 is between the substrate 400 and the diaphragm 404 and held by the dielectric supporting layer 402 at a periphery, having a plurality of second venting holes 472, connecting between the substrate opening 401 and the dielectric opening 414. The second backplate 470 is a stack layer of a conductive layer 446 and a passivation layer 448. The material of the passivation layer 448 in an example is silicon nitride different from the dielectric material of the dielectric supporting layer 402, so the passivation layer 448 covers the conductive layer 446, which serving as a conductive supporting layer.

Based on the structure of the MEMS device in FIG. 9, various kinds of anti-sticky structures can be further formed on the backplates 410, 470 and/or the diaphragm 404 by applying the previous embodiments for the backplate and diaphragm in single backplate itself.

FIG. 10 is a cross-sectional view, schematically illustrating a structure of MEMS device, according to an embodiment of the invention. Referring to FIG. 10, based on the structure of the MEMS device in FIG. 9, the anti-sticky structure 224a, 224b are formed from the diaphragm 404 at both sides in an embodiment. The anti-sticky structures 224a, 224b in an example are a part of the diaphragm 404 during fabrication procedure. The material of the anti-sticky structures 224a, 224b are the same as the material of the diaphragm 404 as an example but not limited to the embodiment.

Figure 11:
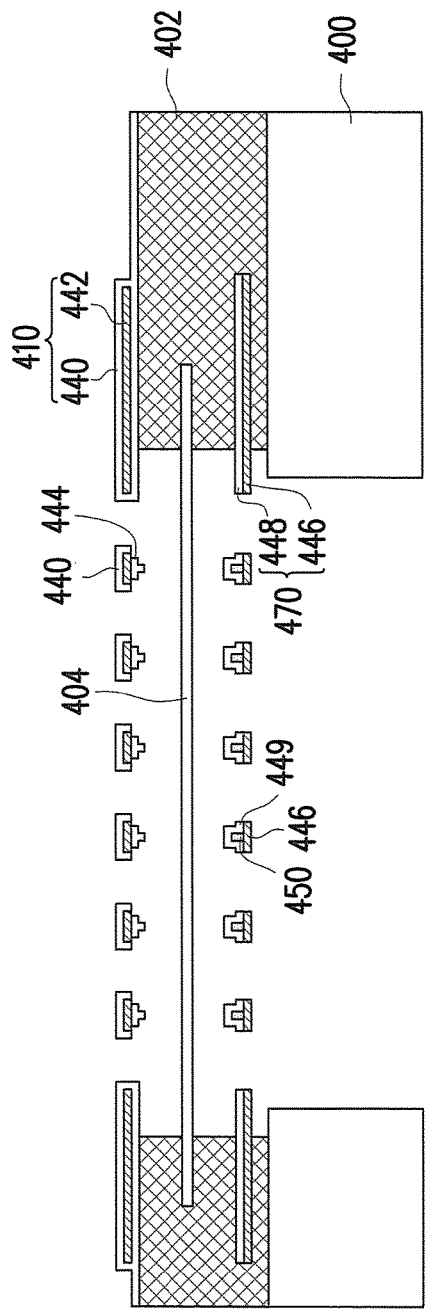
FIG. 11 is a cross-sectional view, schematically illustrating a structure of MEMS device, according to an embodiment of the invention.

Further in another embodiment, FIG. 11 is a cross-sectional view, schematically illustrating a structure of MEMS device, according to an embodiment of the invention. Referring to FIG. 11, like the structure in FIG. 9, the MEMS device with dual backplates may include a substrate 400, a dielectric supporting layer 402, a diaphragm 404, a first backplate 410, and a second backplate 470. However, the anti-sticky structures are included. The first backplate 410 and the second backplate 470 are modified to add the anti-sticky structure.

As to the first backplate 410, the passivation layer 440 of the first backplate 410 comprises a peripheral portion which surrounds a peripheral portion of the conductive layer 442 being held by the dielectric supporting layer 402. In this situation, the conductive layer 442 at the peripheral region does not directly contact to the dielectric supporting layer 402 but is protected by the passivation layer 440.

Additionally, a portion of the passivation layer 440 within the diaphragm region has been further formed with the anti-sticky structure 444 on the second side of the conductive layer 442, protruding toward the diaphragm 404. Another anti-sticky structure, including the dielectric protruding 450 and the protruding element 449 of the passivation layer 448, for formed in the second backplate 470. Here, the protruding element 449 of the passivation layer 448 is within the diaphragm and the dielectric protruding 450 is fully covered between the conductive layer 446 and the passivation layer 448, so that the dielectric protruding 450 causes the protruding element 449 in conformal shape.

Generally, the two anti-sticky structures can be treated as a first anti-sticky structure and a second anti-sticky structure. The first anti-sticky structure is formed either on the first backplate 410 or the diaphragm 404, and is located between the diaphragm 404 and the first backplate 410. The second anti-sticky structure is formed either on the second backplate 470 or the diaphragm 404, and is located between the diaphragm 404 and the second backplate 470. As a result, the probability for the diaphragm 404 sticking to either the first backplate or the second backplate can be effectively reduced.

Figure 12:
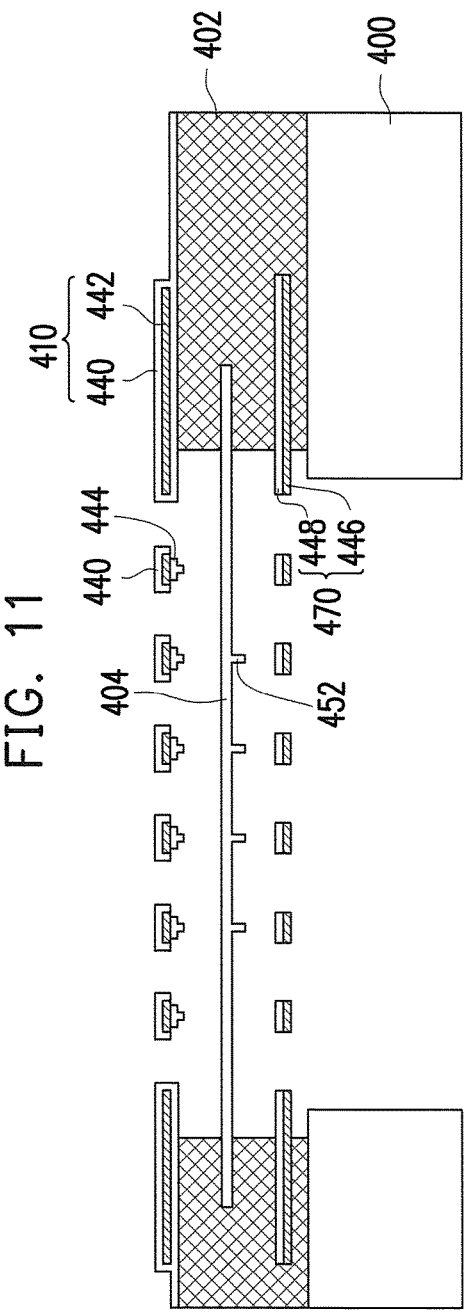
FIG. 12 is a cross-sectional view, schematically illustrating a structure of MEMS device, according to an embodiment of the invention.

FIG. 12 is a cross-sectional view, schematically illustrating a structure of MEMS device, according to an embodiment of the invention. Referring to FIG. 12, as to the structure of MEMS device in FIG. 11, further another embodiment has modified the locations of the two anti-sticky structures. The anti-sticky structure 444 as the first anti-sticky structure is formed on the first backplate 410 without change. However, the anti-sticky structure 452 as the second anti-sticky structure is formed on the diaphragm 404. The anti-sticky structure 444 can be referred to the anti-sticky structure 416 in FIG. 2 with a ㆆ-like structure. In the embodiment, the anti-sticky structure 452, like the structure in FIG. 4, is formed on the diaphragm 404, but protruding toward the second backplate 470. The anti-sticky structure 452 is instead of the anti-sticky structure in the second backplate 470, which has no anti-sticky structure in this embodiment. The peripheral region of the conductive layer 442 in this embodiment is surrounded by the passivation layer 440.

FIG. 13 is a cross-sectional view, schematically illustrating a structure of MEMS device, according to an embodiment of the invention. Referring to FIG. 13, as to the structure of MEMS device in FIG. 12, further another embodiment has modified the locations of the two anti-sticky structures. The anti-sticky structure 454 as the first anti-sticky structure is formed on the first backplate 410, protruding toward the diaphragm 404, like the anti-sticky structure stated in FIG. 3. The anti-sticky structure 454 in an example is a part of the conductive layer 442. The anti-sticky structure 452, like the structure in FIG. 4, is formed on the diaphragm 404, but protruding toward the second backplate 470. The peripheral region of the conductive layer 442 in this embodiment is surrounded by the passivation layer 440.

FIG. 14 is a cross-sectional view, schematically illustrating a structure of MEMS device, according to an embodiment of the invention. Referring to FIG. 14, as to the structure of MEMS device in FIG. 9, further another embodiment has modified the first backplate 460. In the embodiment, the first backplate 460 is just a passivation layer, such silicon nitride without including conductive layer. The first backplate 460 is patterned to form multiple venting holes 412. The second backplate as a stack layer of conductive layer 446 and a passivation layer 448 has also been patterned to have multiple venting holes to connect the dielectric opening and the substrate opening.

As previously stated, the foregoing embodiments can be properly combined to have another embodiment. The anti-sticky structure can be adapted into the MEMS device with single backplate or dual backplates. The backplate structure in one embodiment can be modified by the other embodiment.

The structures of MEMS device are the semiconductor structure and can be fabricated by the semiconductor fabrication processes is different procedure. The following descriptions provide multiple embodiments for the methods to fabricate the MEMS device.

Figure 15A:
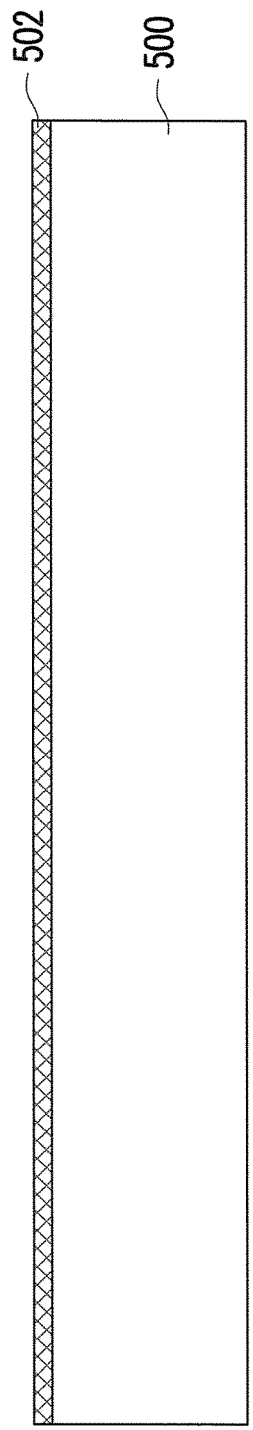
Figure 15B:
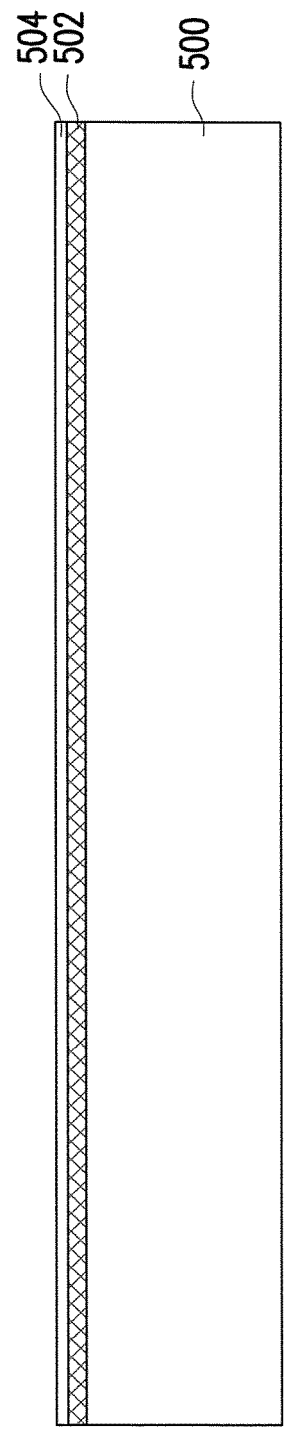

The MEMS device is usually fabricated on a substrate, such as the semiconductor substrate or silicon substrate. FIGS. 15A-15I are cross-sectional views, schematically illustrating fabrication flow for a MEMS device, according to an embodiment of the invention. Referring to FIG. 15A, a substrate 500 is provided as the base. Then, a dielectric layer 502, which is to be fabricated as the dielectric supporting layer, is deposited on the substrate 500. The dielectric layer 502 is silicon oxide, as an example. Referring to FIG. 15B, a conductive layer 504 is further deposited on the dielectric layer 502. The conductive layer 504 is of metal and is to serve as the diaphragm at the end structure.

Figure 15C:
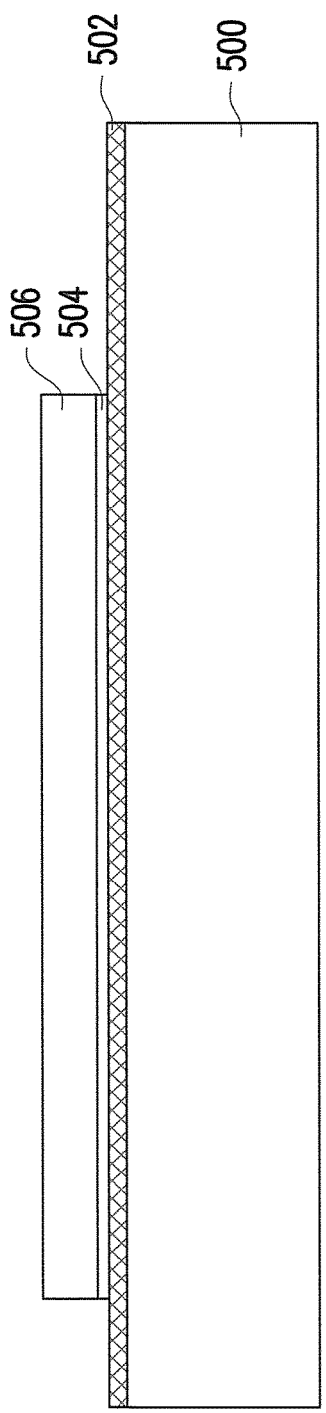
Figure 15D:
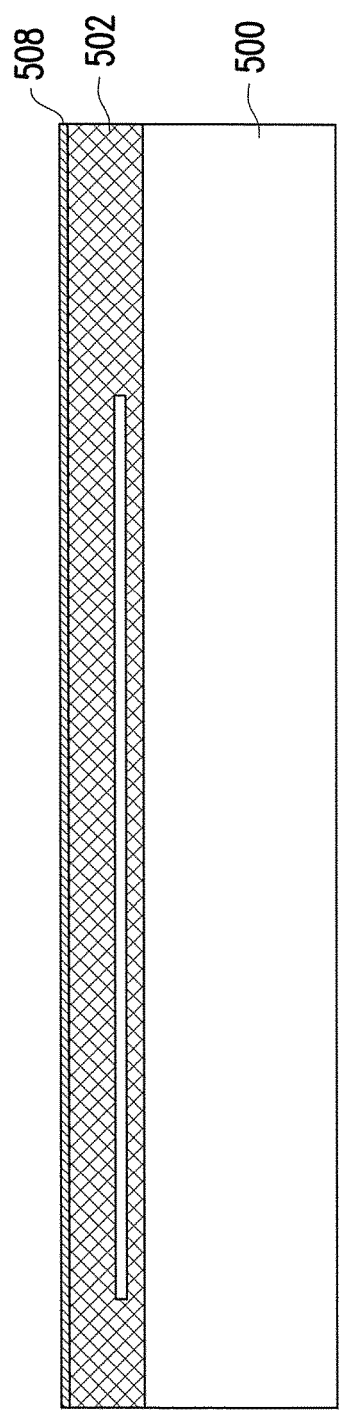

Referring to FIG. 15C, the conductive layer 504 is patterned by photolithographic process and etching process, in which the photoresist layer 506 as the etching mask covers a portion of the conductive layer 504 at the diaphragm region as predetermined. The portion of the conductive layer 504 not covered by the photoresist layer 506 is etched away to expose the dielectric layer 502. Referring to FIG. 15D, the photoresist layer 506 is removed. Additional dielectric layer is further deposited over the previous dielectric layer, so that the dielectric layer 502 is formed. The remaining portion of the conductive layer 504 is embedded in the dielectric layer 502 in current status. A conductive layer 508 is formed on the dielectric layer 502. The conductive layer 508 is to serve as a part of the backplate.

Referring to FIG. 15E, the conductive layer 508 is patterned by photolithographic process and etching process, in which the photoresist layer 510 as the etching mask with the intended pattern covers the conductive layer 508. The portion of the conductive layer 508 not covered by the photoresist layer 510 is etched away, so that a plurality of openings 512, serving as the venting holes at the end structure, is formed in the conductive layer 508 to expose the dielectric layer 502.

Referring to FIG. 15F, the photoresist layer 510 is removed. The, a passivation layer 514 is deposited over the substrate 500 in the conformal shape of the top surface structure. As a result, the bottom and the sidewall of the openings 512 are covered by the passivation layer 514. The passivation layer 514 in material is different from the dielectric layer 502 and is expected to be harder. The passivation layer 514 in an example is silicon nitride. The passivation layer 514 is to serve as a part of backplate in structure later.

Figure 15G:
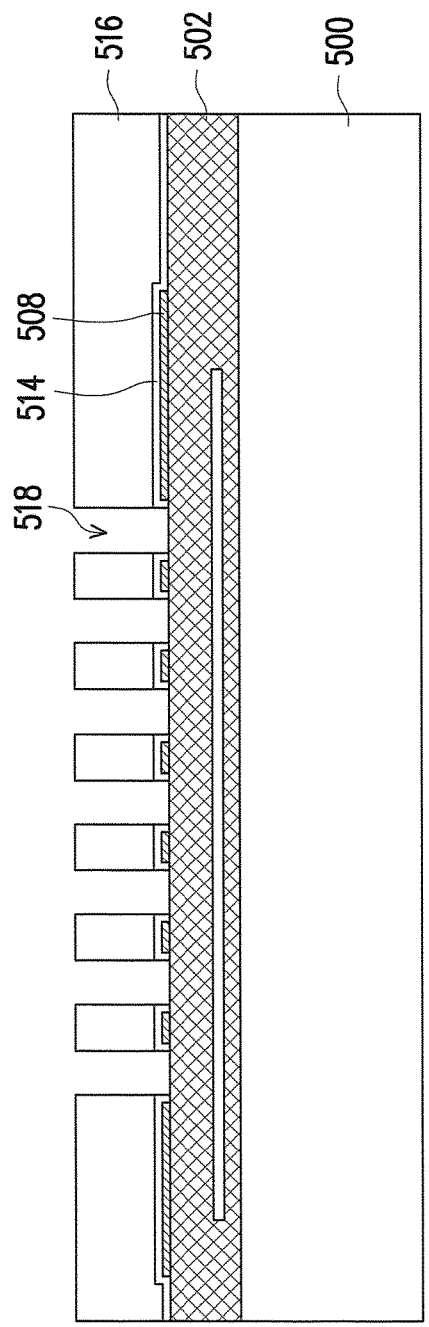

Referring to FIG. 15G, a photoresist layer 516 is formed on the passivation layer 514 with openings 518, corresponding to the venting holes to be formed at the end. After etching process, the passivation layer 514 covering on the bottom of the openings 518 is etched away to expose the dielectric layer 502 again.

Figure 15H:
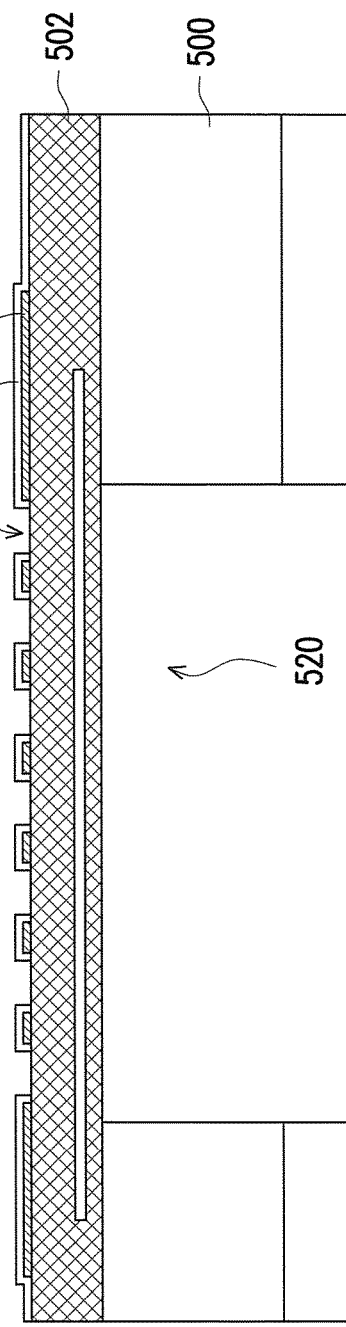

Referring to FIG. 15H, the photoresist layer 516 is removed and another photoresist layer 522 with an opening is formed on the substrate 500 at the other side. After the etching process to the substrate 500, the substrate opening 520 is formed in the substrate 500, corresponding to the diaphragm region. The substrate opening 520 also expose the dielectric layer 502 at the other side surface.

Figure 15I:
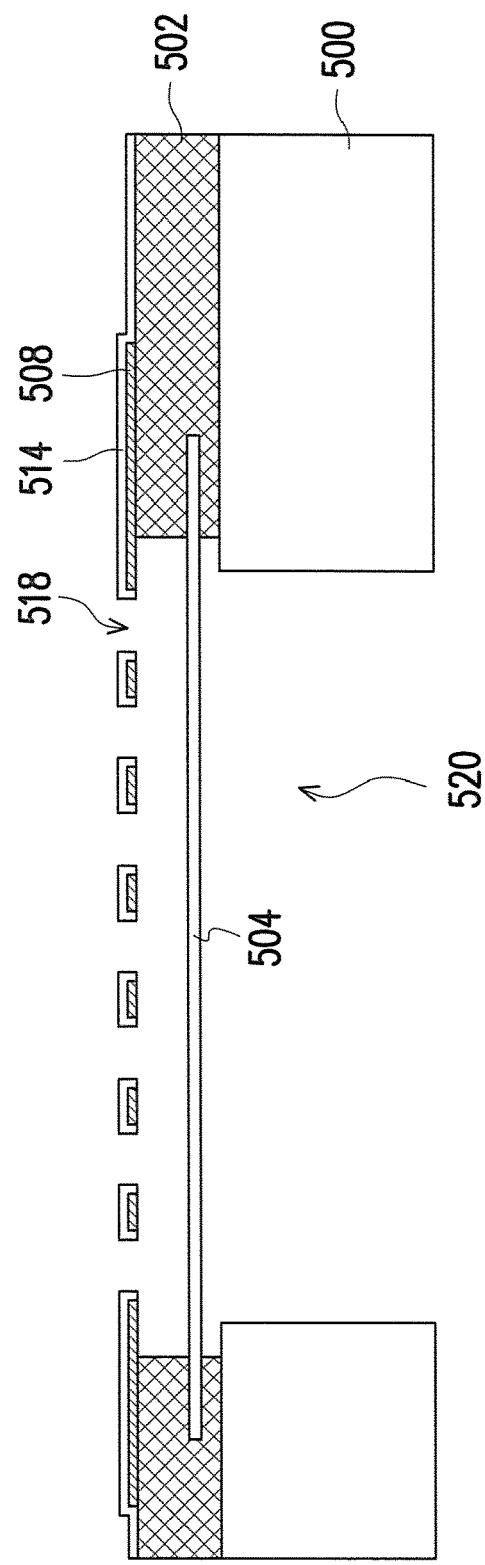

Referring to FIG. 15I, the photoresist layer 522 is removed. It can be noted that the current state of the dielectric layer 502 is exposed at both sides, in which the substrate opening 520 exposes one side of the dielectric layer 502 and the openings 518, serving as the venting holes, expose another side of the dielectric layer 502. Then, an isotropic etching process is performed to selectively etch the dielectric material of the dielectric layer 502 through the openings 518 and the substrate opening 520. The dielectric material of the dielectric layer 502 in the example is silicon oxide, different from the silicon nitride, so that the passivation layer in silicon nitride remains and also serves as the etching mask. The openings 518 become the venting holes of the backplate. The backplate includes the conductive layer 508 and the passivation layer 514. The conductive layer 504 at the diaphragm region is released or exposed to serve as the diaphragm.

The structure of the MEMS device in FIG. 15I is similar to the structure of MEMS device in FIG. 1, but using another set of reference numbers in fabrication manner to indicate the structure elements. At to the fabrication of anti-sticky structure, more procedures would be taken but not shown here. However, it can be understood by the one with ordinary skill in the art. The fabrication of anti-sticky structure would also be described in the MEMS device with dual backplates.

Figure 16C:
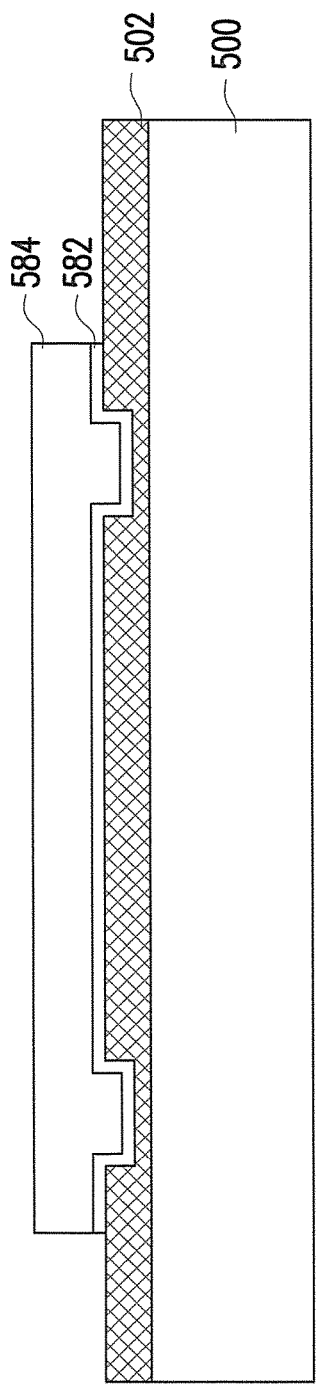

FIGS. 16A-16D are cross-sectional views, schematically illustrating fabrication flow for a MEMS device, according to an embodiment of the invention. The method to fabricate the diaphragm 404 with indent portions as shown in FIG. 7 and FIG. 8 is described. Referring to FIG. 16A, the dielectric layer 502 is formed on the substrate 500. The dielectric layer 502 is patterned by photolithographic process and etching process to form the indents 570. A local region 580 in top view of the indents 570 is also shown.

Referring to FIG. 16B, after removing the photoresist layer 506, a conductive layer 582 is formed over the dielectric layer 502 in conformal shape, in which is indents 570 still remain. Referring to FIG. 16C, another photoresist layer 584 is formed on the conductive layer 582 to cover a portion of the conductive layer 582, in which the diaphragm is to be formed. The etching process is performed to remove the conductive layer 582 not covered by the photoresist layer 584. As a result, the remaining portion of the conductive layer 582 is to serve as the diaphragm with the indent portion at the peripheral regions.

Figure 16D:
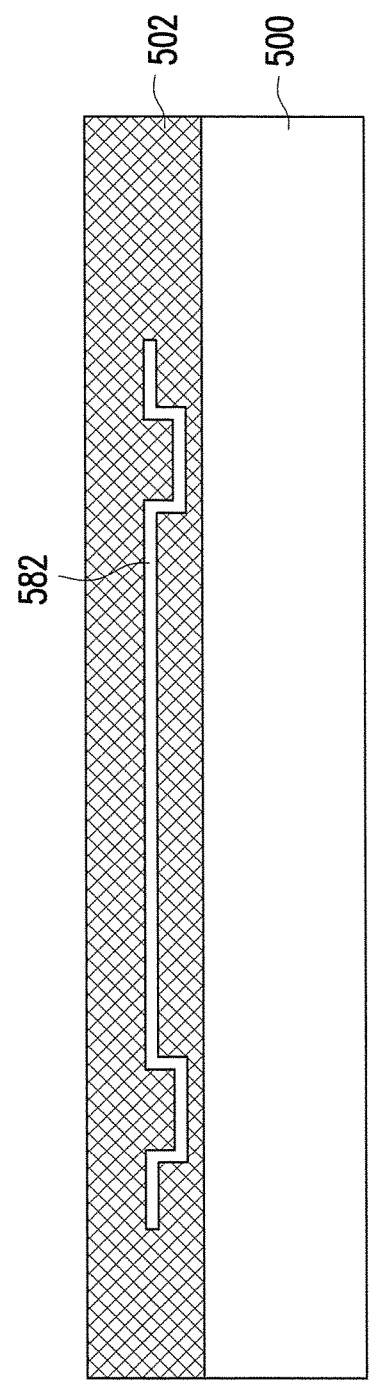

Referring to FIG. 16D, another dielectric layer is deposited over the previous dielectric layer, so to form the dielectric layer 502, which is also to server as the dielectric supporting layer 402 in FIG. 8 to hold the diaphragm at the periphery. The conductive layer 582 in FIG. 16D is serving as the diaphragm 404 in FIG. 8. The subsequent processes to form the backplate, pattern the substrate 500 and release the conductive layer 582 can be known by referring to the previous embodiments in fabrication as shown in FIG. 7 and FIG. 15, and are not further described.

Figure 17A:
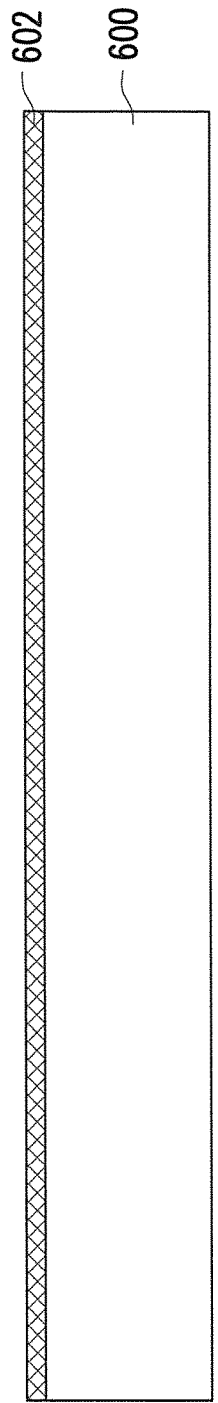
Figure 17B:
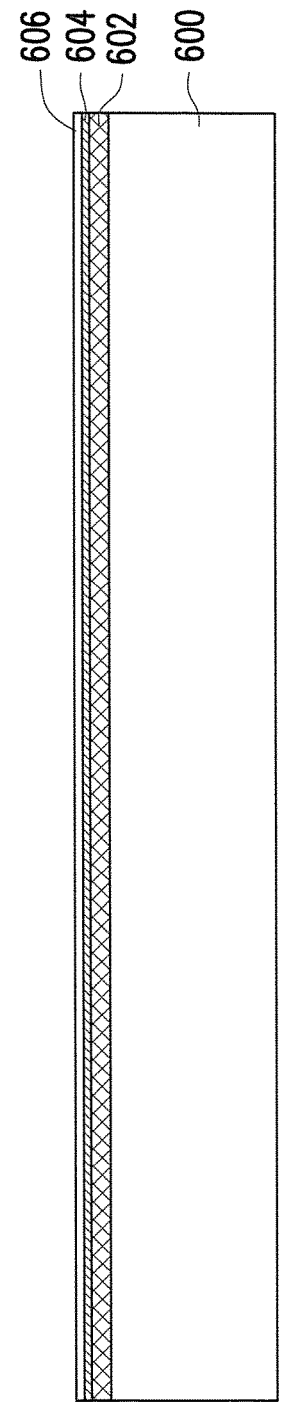

The following descriptions provide the embodiment to fabricate the MEMS device with dual backplates. The anti-sticky structures are also fabricated. FIGS. 17A-17K are cross-sectional views, schematically illustrating fabrication flow for a MEMS device, according to an embodiment of the invention. Referring to FIG. 17A, a dielectric layer 602 is formed on a substrate 600. Referring to FIG. 17B, a conductive layer 604 is formed on the dielectric layer 602. A passivation layer 606 is formed on the conductive layer 604. The conductive layer 604 and the passivation layer 606 are stacked as a stack layer to provide the second backplate at the end structure.

Figure 17C:
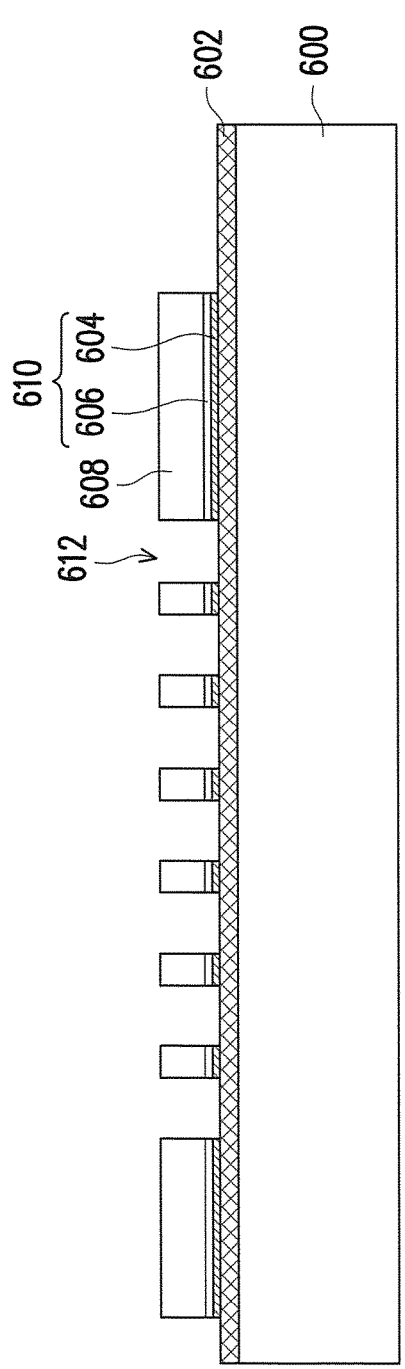

Referring to FIG. 17C, the conductive layer 604 and the passivation layer 606 are patterned with the photoresist layer 608. The openings 612 are formed in the backplate 610 of the conductive layer 604 and the passivation layer 606 to expose the dielectric layer 602.

Figure 17D:
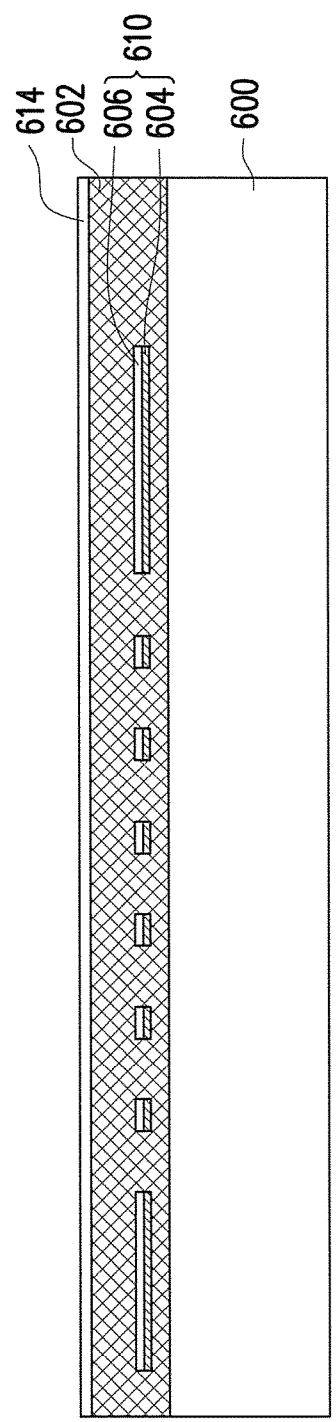

Referring to FIG. 17D, after the photoresist layer 608 is removed, another dielectric layer is deposited over the previous dielectric layer to form the new dielectric layer 602. The conductive layer 604 and the passivation layer 606, serving as the backplate 610, are embedded in the dielectric layer 602 at the current state. A conductive layer 614, as to be serving as a diaphragm later, is formed on the dielectric layer 602.

Figure 17E:
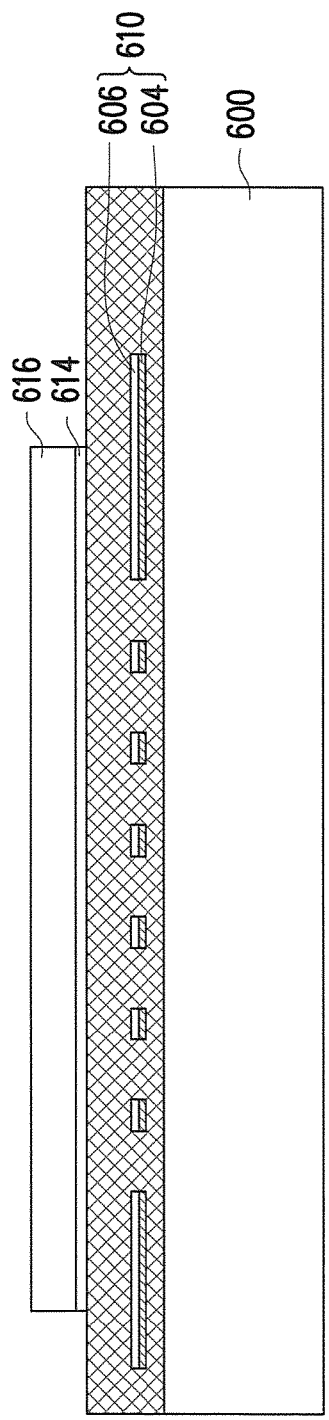

Referring to FIG. 17E, the conductive layer 614 is etched by using the photoresist layer 616 as the etching mask. As a result, the remaining portion of the conductive layer 614 would be used as the diaphragm.

Figure 17F:
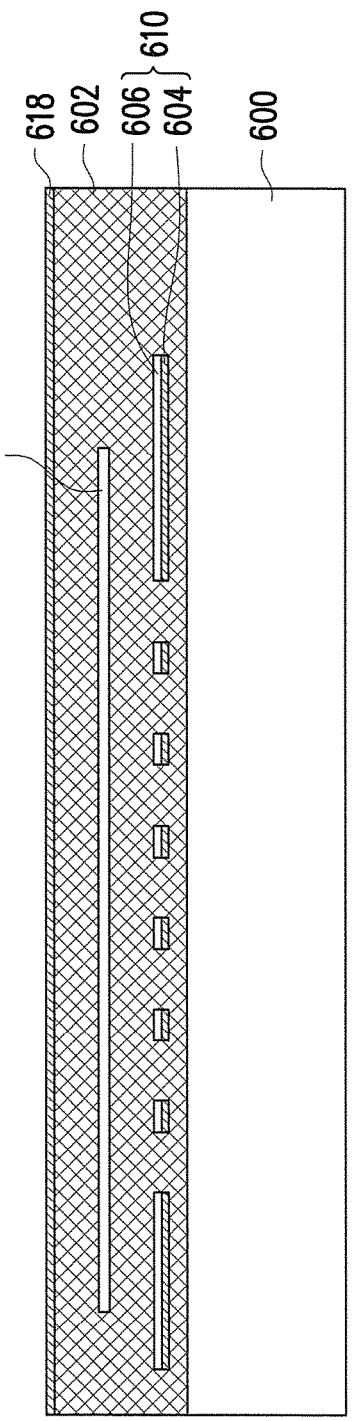

Referring to FIG. 17F, another dielectric material is deposited over the previous dielectric layer 502 to have the new dielectric layer 602. As a result, the conductive layer 614 is embedded the dielectric layer 602. Another conductive layer 618 is then formed on the dielectric layer 602.

As an example to combine with the other embodiments, the procedure in FIGS. 16A-16D can be taken in combination with the procedure in FIGS. 17A-17F to form the diaphragm 614 with the indent portions distributed at the peripheral region.

Referring to FIG. 17G, the conductive layer 618 is patterned by using the photoresist layer 620 as the etching mask, so to form the opening 622 in the conductive layer 618 to expose the dielectric layer 602.

Referring to FIG. 17H, another passivation layer 624 is deposited over the conductive layer 618, conformal to the top surface structure. The region of the dielectric layer 602 exposed by the opening 622 in the conductive layer 618 is also covered by the passivation layer 624. The conductive layer 618 and the passivation layer 624 are to form the first backplate 650 later.

Referring to FIG. 17I, a photoresist layer 626 is used as the etching mask, so the opening 628, serving as the venting holes in the backplate 650, are formed to expose the dielectric layer 602.

Referring to FIG. 17J, the substrate 600 is patterned from the other side by using the photoresist layer 632 as the etching mask, so to form a substrate opening 630 to expose the dielectric layer 602 at the other side. In the current state, the dielectric layer 602 is exposed at both sides by the substrate opening 630 and the openings 628 in the backplate 650.

Figure 17K:
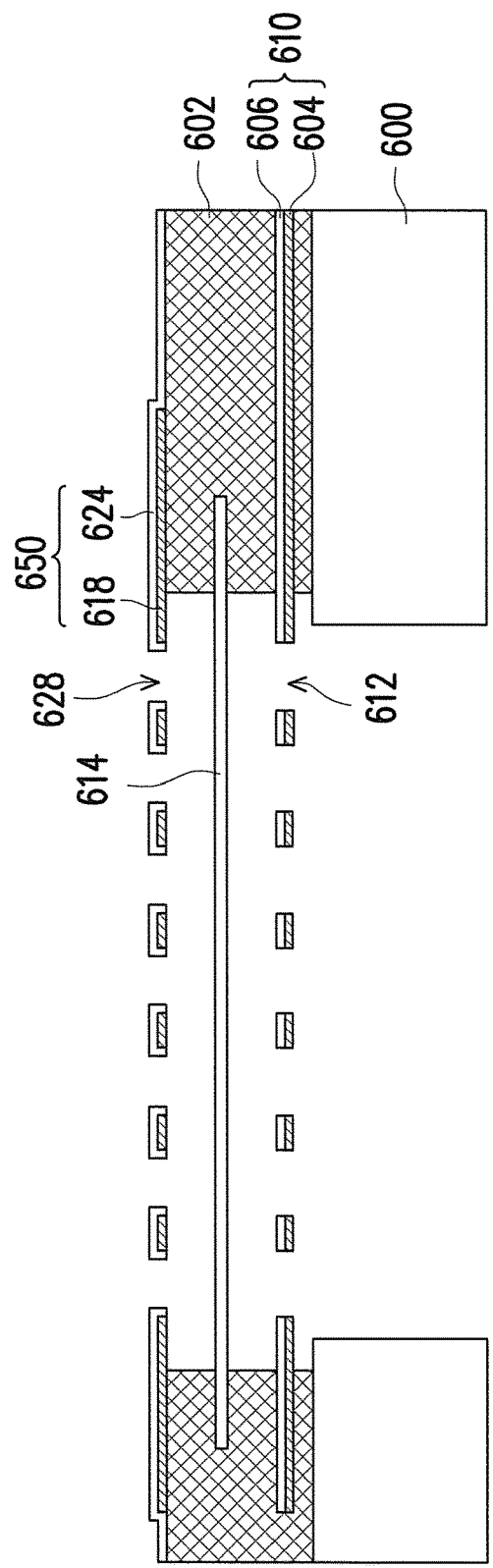

Referring to FIG. 17K, the substrate 600 with the structure form on the substrate 600 are etched by isotropic etching process, such as wet etching, to selectively etch the dielectric material, such as silicon oxide, of the dielectric layer 602 from the substrate opening 630 and the openings 628. The second backplate 610 has also the openings 612, which are to serve as the venting holes, and allow the etching process to reach the diaphragm 614. As a result, the diaphragm 614, the first backplate 650 and the second backplate 610 are exposed at the diaphragm region. The MEMS device similar to the MEMS device in FIG. 9 as an example with dual backplates is formed.

If the anti-sticky structure is intended, the procedure in the fabrication method can be modified to form the anti-sticky structure. Several embodiments to fabricate the anti-sticky structure are provided for further descriptions, but the invention is not limited to the embodiments.

Figure 18A:
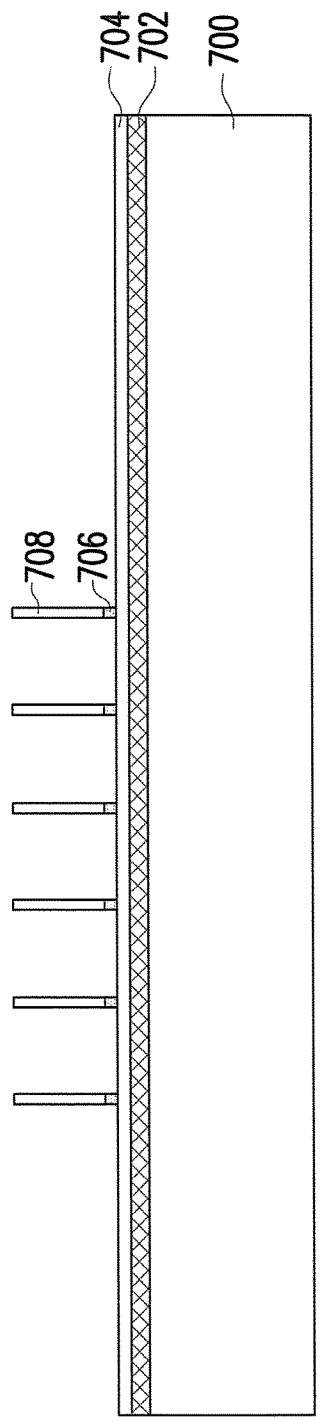
FIGS. 18A-18B are cross-sectional views, schematically illustrating fabrication flow for a MEMS device, according to an embodiment of the invention.
Figure 18B:
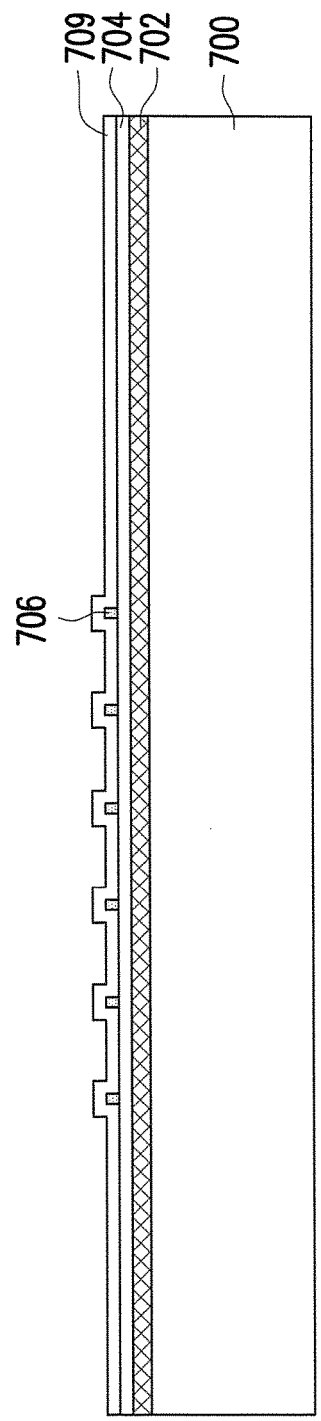

FIGS. 18A-18B are cross-sectional views, schematically illustrating fabrication flow for a MEMS device, according to an embodiment of the invention. Referring to FIG. 18A, the dielectric layer 702 is formed on the substrate 700. A conductive layer 704 is formed on the dielectric layer 702. A dielectric layer 706 before being patterned is deposited on the conductive layer 704. The dielectric layer 706 is then patterned by using the photoresist layer 708 as the etching mask. As a result, the remaining portion of the dielectric layer 706 is a protruding structure.

Referring to FIG. 18B, after the photoresist layer 708 is removed, a passivation layer 709 is further formed over the conductive layer 704 and the dielectric layer 706. Since the dielectric layer 706 provides the protruding structure, the passivation layer 709 also has the protruding structure to serve as the anti-sticky structure. This anti-sticky structure can be applied to the MEMS device in FIG. 18, corresponding to the backplate 470. The subsequent procedures can be continuously performed, but not described here. As a result, the diaphragm is released.

Figure 19C:
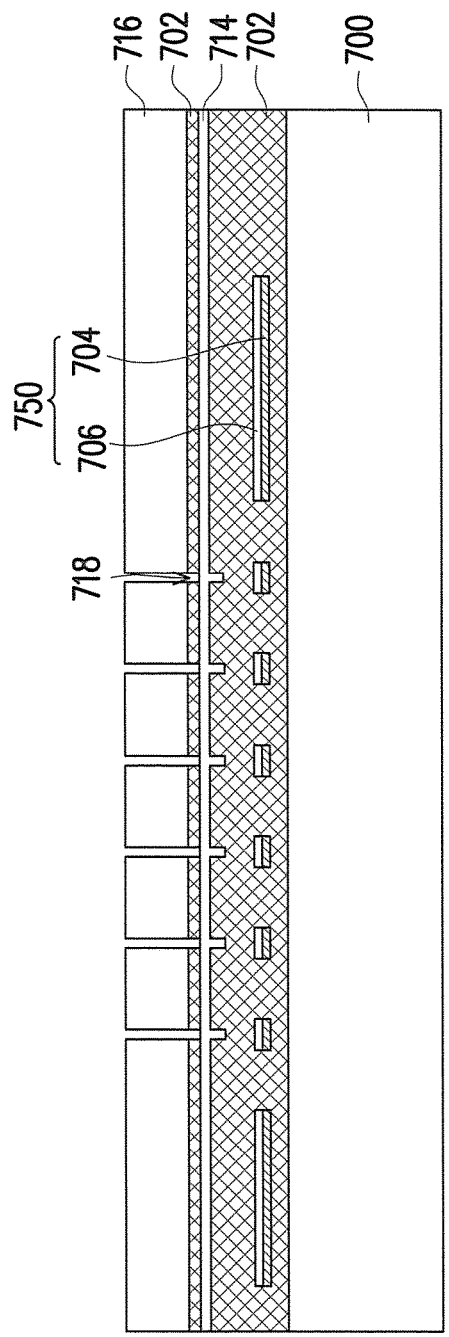

Further, FIGS. 19A-19E are cross-sectional views, schematically illustrating fabrication flow for a MEMS device, according to an embodiment of the invention. Referring to FIG. 19A, based on the structure having the dielectric layer 702, in which the backplate has been embedded, the anti-sticky structure can be formed on the diaphragm by first patterning the dielectric layer 702 with the photoresist layer 710. As a result, an indent 712 is formed on the surface of the dielectric layer 702.

Referring to FIG. 19B, after the photoresist layer 710 is removed, a conductive layer 714 formed over the dielectric layer 702, in which the indent 712 is also filled by the conductive layer 714 to have the anti-sticky structure 715, similar to the anti-sticky structure 224a in FIG. 10.

Referring to FIG. 19C, another portion of the dielectric layer 702 is formed over the conductive layer 714. The dielectric layer 702 is then patterned again by using the photoresist layer 716 as the etching mask, to have another indent 718 to expose the conductive layer 714.

Figure 19D:
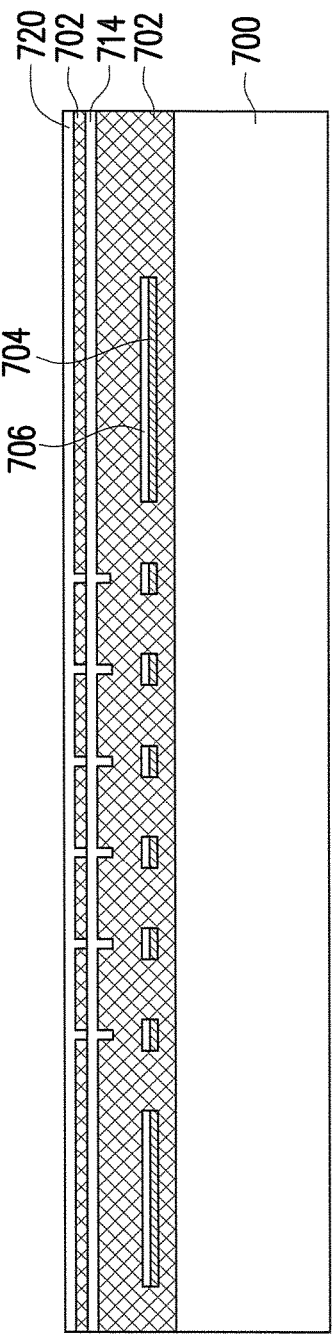

Referring to FIG. 19D, after removing the photoresist layer 716, another conductive layer 720 is formed over the dielectric layer 702 and fills the indent 718 to contact the conductive layer 714.

Figure 19E:
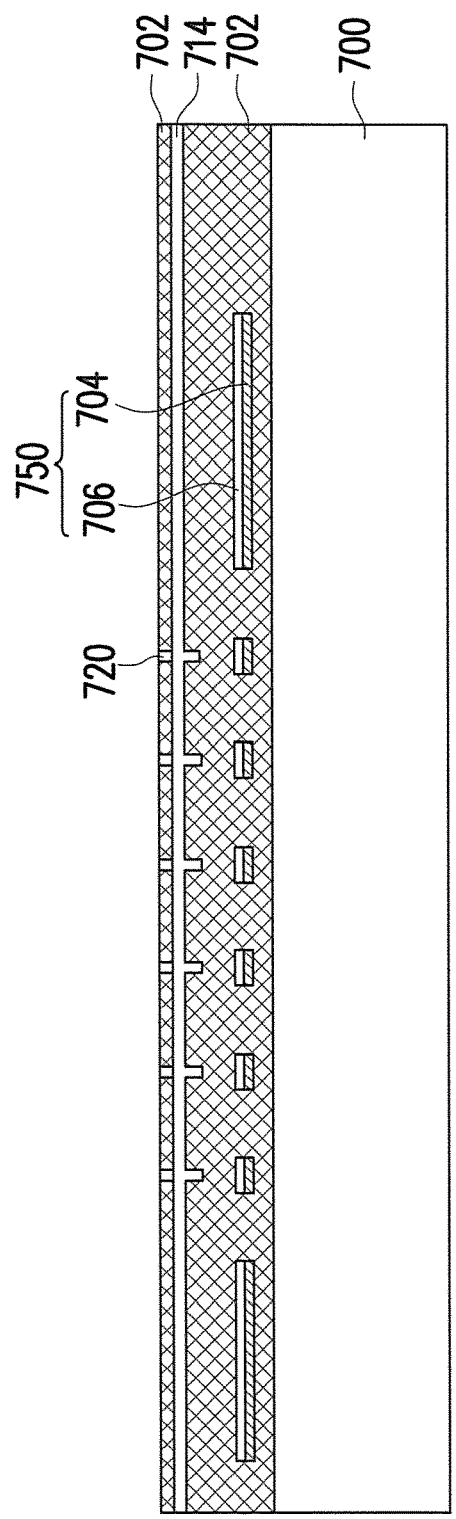

Referring to FIG. 19E, the conductive layer 720 on the dielectric layer 702 is removed by for example etching back process or polishing process. The residual portion of the conductive layer 720 just fills the indent 718 to serve as another anti-sticky structure. The conductive layer 714 with two anti-sticky structures at both sides is to serve as the diaphragm at the end structure, such as diaphragm structure of the MEMS device in FIG. 10. The descriptions for the subsequent procedures are omitted here. As a result, the diaphragm is released.

Figure 20A:
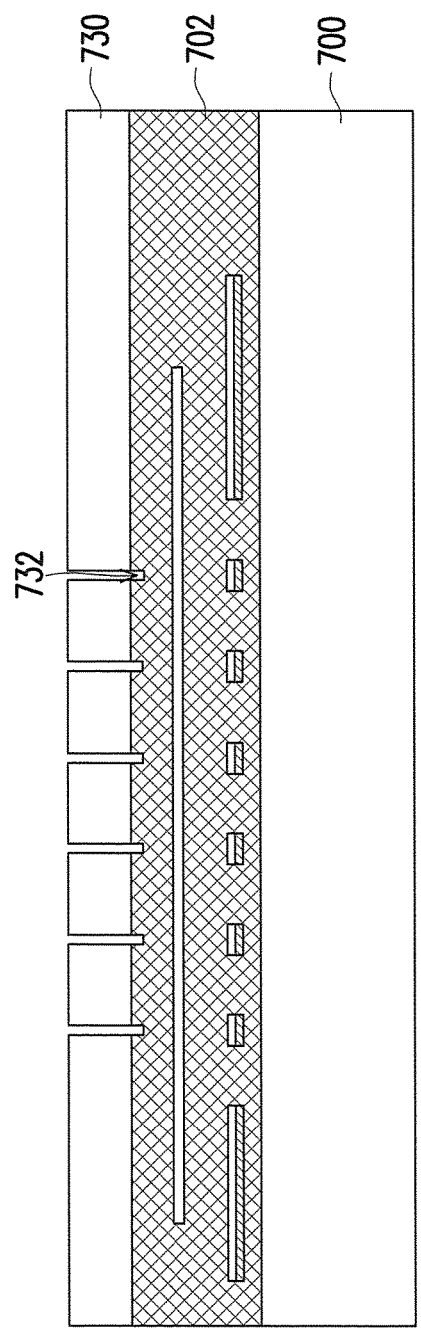
FIGS. 20A-20D are cross-sectional views, schematically illustrating fabrication flow for a MEMS device, according to an embodiment of the invention.

Further, FIGS. 20A-20D are cross-sectional views, schematically illustrating fabrication flow for a MEMS device, according to an embodiment of the invention. Referring to FIG. 20A, based on the structure having the dielectric layer 702, in which the backplate has been embedded, the anti-sticky structure can be formed on the first backplate by first patterning the dielectric layer 702 with the photoresist layer 730. As a result, an indent 732 is formed on the top surface of the dielectric layer 702.

Figure 20B:
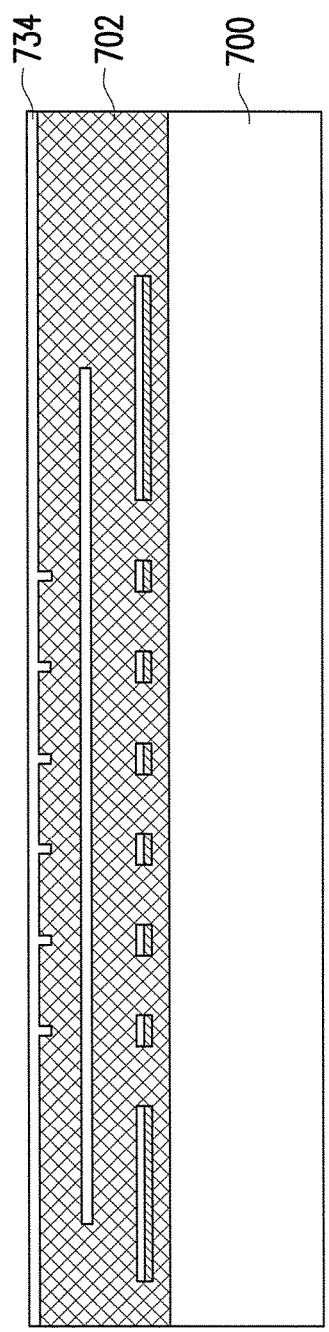

Referring to FIG. 20B, a passivation layer 734 is formed on the dielectric layer 702 and also fills the indent 732.

Figure 20C:
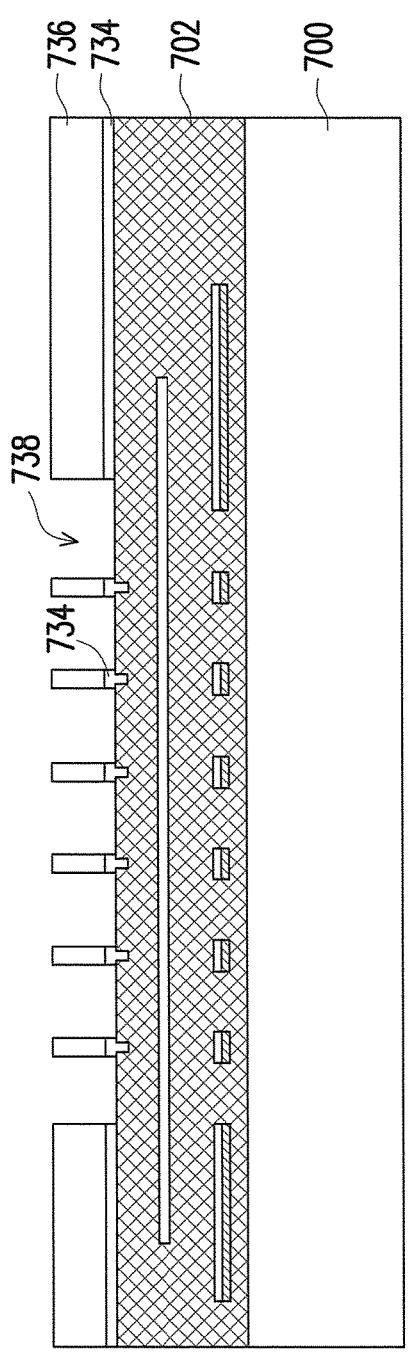

Referring to FIG. 20C, the passivation layer 734 is patterned by using the photoresist layer 736 as the etching mask. The photoresist layer 736 has the opening 738, which exposes a portion of the passivation layer 734 but not the portion corresponding to the indent 732. After the passivation layer 734 is etched with the etching mask of photoresist layer 736, the ⊤-like structure of the passivation layer 734 in cross-sectional view is formed corresponding to the indent 732.

Figure 20D:
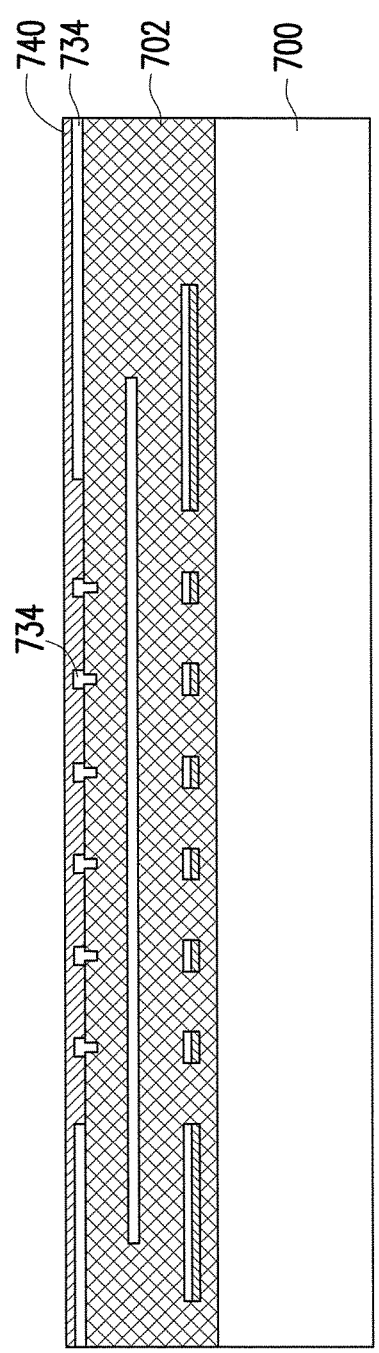

Referring to FIG. 20D, after removing the photoresist layer 736, a conductive layer 740 is formed over the dielectric layer 702 and the passivation layer 734. As a result, the top backplate can be formed by including the conductive layer 740 and the passivation layer 734 covered by the conductive layer 740 at a side opposite to the diaphragm. The passivation layer 734 has a central portion and a peripheral portion. The central portion is corresponding to the diaphragm region to provide the anti-sticky structure. The peripheral portion is on the dielectric layer 702 and is covered by a peripheral portion of the conductive layer 740.

The subsequent procedures can be further performed to have the end structure of the MEMS device in an embodiment. Here, only the part to form the anti-sticky structure on the top backplate in an embodiment is described. As a result, the diaphragm is released.

The present invention has proposed the MEMS device with single backplate or dual backplates. Further, the anti-sticky structure is also disclosed. In an embodiment of fabrication method, the MEMS device is fabricated on a substrate by a method comprising: forming a dielectric supporting layer on the substrate, wherein the dielectric supporting layer is embedded with a diaphragm; forming a first backplate on the dielectric supporting layer, wherein the backplate has been patterned to have a plurality of venting holes with a diaphragm region as predetermined, wherein the backplate comprises a conductive layer on the dielectric supporting layer and a passivation layer covering over the conductive layer, wherein the passivation layer of the first backplate comprises a peripheral portion which surrounds a peripheral portion of the conductive layer to be held by the dielectric supporting layer at an end state; patterning the substrate from a side opposite to the dielectric supporting layer, to form a substrate opening to expose the dielectric supporting layer; and performing an isotropic etching process, to remove a portion of dielectric material of the dielectric supporting layer through the venting holes and the substrate opening, so that the dielectric supporting layer has a dielectric opening to expose the diaphragm within the diaphragm region. The dielectric opening also exposes an inner portion of each of the indents of the diaphragm.

Further, a first anti-sticky structure is formed either on the first backplate or the diaphragm between the diaphragm and the first backplate embedded in the dielectric supporting layer. The first anti-sticky structure is exposed in the step of performing the isotropic etching process. A second backplate is formed and embedded in the dielectric supporting layer between the substrate and the diaphragm, wherein the second backplate has a plurality of second venting holes. The step of performing the isotropic etching process etches the dielectric material also through the second venting holes.

Further, a second anti-sticky structure either on the second backplate or the diaphragm between the diaphragm and the second backplate embedded in the dielectric supporting layer. The second anti-sticky structure is exposed in the step of performing the isotropic etching process.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A Micro-Electro-Mechanical Systems (MEMS) device, comprising:
    a substrate, having a substrate opening corresponding to a diaphragm region;
    a dielectric supporting layer, disposed directly on the substrate, having a dielectric opening corresponding to the substrate opening to form the diaphragm region;
    a diaphragm, within the dielectric opening, wherein a periphery of the diaphragm is embedded into the dielectric supporting layer; and
    a first backplate, disposed on the dielectric supporting layer, having a plurality of first venting holes, connecting to the dielectric opening, wherein the first backplate comprises a conductive layer and a passivation layer covering over the conductive layer at a first side opposite to the diaphragm, wherein a second side of the conductive layer is facing to the diaphragm and not covered by the passivation layer, wherein the dielectric supporting layer is disposed in between the first backplate and the substrate, and wherein a periphery portion of the conductive layer of the first backplate is disposed on the dielectric supporting layer.

2. The MEMS device of claim 1, further comprising an anti-sticky structure on the second surface of the conductive layer of the first backplate.

3. The MEMS device of claim 1, wherein the conductive layer of the first backplate comprises an anti-sticky structure, protruding from the second surface.

4. The MEMS device of claim 1, wherein the diaphragm comprises an anti-sticky structure, protruding toward the first backplate.

5. The MEMS device of claim 4, wherein the conductive layer of the first backplate comprises an additional anti-sticky structure, protruding from the second surface and corresponding to the anti-sticky structure of the diaphragm.

6. The MEMS device of claim 1, wherein the diaphragm comprises a plurality of the indent portions distributed at the periphery, wherein the dielectric opening exposes an inner part of each of the indent portions.

7. MEMS device of claim 1, further comprising:
a second backplate, between the substrate and the diaphragm, held by the dielectric supporting layer at a periphery, having a plurality of second venting holes, connecting between the substrate opening and the dielectric opening.

8. The MEMS device of claim 7, wherein the conductive layer of the first backplate also comprises a first anti-sticky structure on the second surface.

9. The MEMS device of claim 8, further comprising a second anti-sticky structure on the second backplate, respectively protruding toward the first anti-sticky structure.

10. The MEMS device of claim 9, wherein the second backplate comprises a stack of a conductive layer and a dielectric layer, wherein the dielectric layer is facing to the diaphragm and the second anti-sticky structure is formed from the dielectric layer.

11. The MEMS device of claim 7, wherein the passivation layer of the first backplate comprises a peripheral portion which surrounds a peripheral portion of the conductive layer being held by the dielectric supporting layer.

12. The MEMS device of claim 7, wherein the conductive layer of the first backplate comprises a first anti-sticky structure, protruding from the second surface, wherein the diaphragm further comprises a second anti-sticky structure, protruding toward the second backplate.

13. The MEMS device of claim 12, wherein the passivation layer of the first backplate comprises a first anti-sticky structure on the second side of the conductive layer.

14. The MEMS device of claim 13, wherein the diaphragm comprises a second anti-sticky structure protruding toward the first backplate.

15. The MEMS device of claim 7, wherein the diaphragm having a first surface and second surface comprises a first anti-sticky structure protruding from the first surface toward the first backplate and a second anti-sticky structure protruding from the second surface toward the second backplate.

16. The MEMS device of claim 7, wherein the conductive layer of the first backplate comprises a first anti-sticky structure, protruding toward the diaphragm and the diaphragm has a second anti-sticky structure, protruding toward second backplate.

17. The MEMS device of claim 7, wherein the diaphragm comprises a plurality of the indent portions distributed at the periphery, wherein the dielectric opening exposes an inner part of each of the indent portions.

\* \* \* \* \*